(12) United States Patent
Hirose et al.

(10) Patent No.: US 8,318,298 B2
(45) Date of Patent: *Nov. 27, 2012

(54) LAYERED SHEETS AND PROCESSES FOR PRODUCING THE SAME

(75) Inventors: Junji Hirose, Osaka (JP); Takeshi Fukuda, Osaka (JP)

(73) Assignee: Toyo Tire & Rubber Co., Ltd., Osaka-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/038,849

(22) Filed: Mar. 2, 2011

(65) Prior Publication Data

US 2011/0151240 A1    Jun. 23, 2011

Related U.S. Application Data

(62) Division of application No. 11/995,311, filed as application No. PCT/JP2006/313597 on Jul. 7, 2006, now Pat. No. 7,927,452.

(30) Foreign Application Priority Data

| Jul. 15, 2005 | (JP) | 2005-206950 |
| Mar. 16, 2006 | (JP) | 2006-072873 |
| Mar. 16, 2006 | (JP) | 2006-072907 |
| Mar. 16, 2006 | (JP) | 2006-072945 |
| Mar. 16, 2006 | (JP) | 2006-072957 |

(51) Int. Cl.
*B32B 27/08* (2006.01)
*B32B 3/26* (2006.01)

(52) U.S. Cl. ......... 428/319.3; 428/315.5; 428/315.7; 428/314.2; 451/533

(58) Field of Classification Search ........ 428/319.3, 428/315.5, 315.7, 314.2; 451/533
See application file for complete search history.

(56) References Cited

U.S. PATENT DOCUMENTS

| 3,049,463 | A | | 8/1962 | Kallander et al. |
| 3,284,274 | A | * | 11/1966 | Hulslander et al. ......... 442/63 |
| 4,216,177 | A | | 8/1980 | Otto |
| 5,409,770 | A | | 4/1995 | Netsu et al. |
| 5,607,982 | A | | 3/1997 | Heyman et al. |
| 6,099,954 | A | * | 8/2000 | Urbanavage et al. ...... 428/314.2 |
| 6,107,355 | A | * | 8/2000 | Horn et al. ............... 521/51 |
| 6,420,448 | B1 | * | 7/2002 | Hnatow et al. ............ 521/174 |
| 6,803,495 | B2 | * | 10/2004 | Simpson ................ 602/46 |
| 7,261,625 | B2 | | 8/2007 | Hishiki |
| 7,291,063 | B2 | | 11/2007 | Swisher et al. |
| 7,378,454 | B2 | | 5/2008 | Masui et al. |
| 7,762,870 | B2 | | 7/2010 | Ono et al. |
| 8,148,441 | B2 | | 4/2012 | Doura et al. |
| 8,167,690 | B2 | | 5/2012 | Fukuda et al. |
| 2002/0183409 | A1 | | 12/2002 | Seyanagi et al. |
| 2003/0109209 | A1 | | 6/2003 | Hishiki |
| 2004/0024719 | A1 | | 2/2004 | Adar et al. |
| 2004/0142641 | A1 | | 7/2004 | Ohno et al. |
| 2004/0166790 | A1 | | 8/2004 | Balijepalli et al. |
| 2005/0064709 | A1 | | 3/2005 | Shimomura et al. |
| 2005/0112354 | A1 | | 5/2005 | Kume et al. |
| 2005/0222288 | A1 | | 10/2005 | Seyanagi et al. |
| 2006/0022368 | A1 | | 2/2006 | Lee et al. |
| 2006/0280929 | A1 | | 12/2006 | Shimomura et al. |
| 2006/0280930 | A1 | | 12/2006 | Shimomura et al. |
| 2007/0275226 | A1 | | 11/2007 | Kulp |
| 2008/0305720 | A1 | | 12/2008 | Hirose et al. |
| 2009/0011221 | A1 | | 1/2009 | Kawaguchi et al. |
| 2009/0047872 | A1 | | 2/2009 | Fukuda et al. |
| 2009/0093202 | A1 | | 4/2009 | Fukuda et al. |
| 2009/0137188 | A1 | | 5/2009 | Fukuda et al. |
| 2009/0137189 | A1 | | 5/2009 | Fukuda et al. |
| 2009/0148687 | A1 | | 6/2009 | Hirose et al. |
| 2010/0003896 | A1 | | 1/2010 | Nakai et al. |
| 2010/0009611 | A1 | | 1/2010 | Fukuda et al. |
| 2010/0029182 | A1 | * | 2/2010 | Fukuda et al. ............ 451/41 |
| 2010/0029185 | A1 | * | 2/2010 | Fukuda et al. ............ 451/527 |
| 2010/0048102 | A1 | | 2/2010 | Nakai et al. |
| 2010/0120249 | A1 | | 5/2010 | Hirose et al. |
| 2010/0162631 | A1 | | 7/2010 | Sato et al. |
| 2010/0221984 | A1 | | 9/2010 | Doura et al. |
| 2010/0317263 | A1 | * | 12/2010 | Hirose et al. ........... 451/41 |
| 2011/0256817 | A1 | | 10/2011 | Fukuda et al. |
| 2012/0108065 | A1 | | 5/2012 | Fukuda et al. |
| 2012/0108149 | A1 | | 5/2012 | Fukuda et al. |

FOREIGN PATENT DOCUMENTS

| CN | 1407606 | 4/2003 |
| CN | 1586002 | 2/2005 |
| CN | 1602321 | 3/2005 |
| CN | 1625575 | 6/2005 |
| JP | 60-042431 | 3/1985 |

(Continued)

OTHER PUBLICATIONS

Japanese Notification of Reasons for Refusal mailed Apr. 8, 2011 directed towards corresponding Japanese Patent Application No. 2006-072873; 6 pages.

Japanese Notification of Reasons for Refusal mailed Apr. 8, 2011 directed towards corresponding Japanese Patent Application No. 2006-072945; 6 pages.

(Continued)

*Primary Examiner* — Hai Vo
(74) *Attorney, Agent, or Firm* — Morrison & Foerster LLP

(57) ABSTRACT

Provided herein is a process for producing a layered sheet. The process involves preparing a cell dispersed urethane composition by a mechanical foaming method. The cell dispersed urethane composition is applied to a base material sheet and cured to produce a polyurethane foam layer of uniform thickness. A releasing sheet may be utilized to make the thickness of the polyurethane foamed layer uniform. Also, provided herein is a layered sheet produced by the above process. The polyurethane foamed layer may have spherical fine cells having an average cell diameter of 20 to 300 μm. The polyurethane foamed layer may have a specific gravity of 0.2 to 0.5. The polyurethane foamed layer may also have a Asker C hardness of 10 to 50 degrees.

2 Claims, 2 Drawing Sheets

FOREIGN PATENT DOCUMENTS

| | | |
|---|---|---|
| JP | 2-100321 | 4/1990 |
| JP | 4-159084 | 6/1992 |
| JP | 4-202215 | 7/1992 |
| JP | 5-329852 | 12/1993 |
| JP | 06-023664 | 2/1994 |
| JP | 6-262633 | 9/1994 |
| JP | 11-207758 | 8/1999 |
| JP | 2000-246620 | 9/2000 |
| JP | 2001-62703 | 3/2001 |
| JP | 2002-060452 | 2/2002 |
| JP | 2002-217149 | 8/2002 |
| JP | 2002-226608 | 8/2002 |
| JP | 2002-264912 | 9/2002 |
| JP | 2002-307293 | 10/2002 |
| JP | 2002-355754 | 12/2002 |
| JP | 2003-37089 | 2/2003 |
| JP | 2003-100681 | 4/2003 |
| JP | 2003-209079 | 7/2003 |
| JP | 2003-304951 | 10/2003 |
| JP | 2004-002788 | 1/2004 |
| JP | 3490431 | 1/2004 |
| JP | 2004-87647 | 3/2004 |
| JP | 2004-119657 | 4/2004 |
| JP | 2004-169038 | 6/2004 |
| JP | 2004-188716 | 7/2004 |
| JP | 2004-291155 | 10/2004 |
| JP | 2004-335713 | 11/2004 |
| JP | 2004-337992 | 12/2004 |
| JP | 2005-34971 | 2/2005 |
| JP | 2005-68175 | 3/2005 |
| JP | 2005-131720 | 5/2005 |
| JP | 2005-153053 | 6/2005 |
| JP | 2005-330621 | 12/2005 |
| JP | 2006-502300 | 1/2006 |
| JP | 2006-35367 | 2/2006 |
| JP | 2006-75914 | 3/2006 |
| JP | 2006-222349 | 8/2006 |
| JP | 2006-519115 | 8/2006 |
| JP | 2006-231429 | 9/2006 |
| JP | 2006-255828 | 9/2006 |
| JP | 2006-265303 | 10/2006 |
| JP | 2006-297515 | 11/2006 |
| JP | 2006-334745 | 12/2006 |
| JP | 2006-339570 | 12/2006 |
| JP | 2006-342191 | 12/2006 |
| JP | 2007-112032 | 5/2007 |
| JP | 2007-283712 | 11/2007 |
| JP | 2007-307700 | 11/2007 |
| JP | 2008-31034 | 2/2008 |
| JP | 2008-156519 | 7/2008 |
| TW | I222390 | 10/2004 |
| TW | 200806431 | 2/2008 |
| WO | WO-01/96434 | 12/2001 |
| WO | WO-2005/055693 | 6/2005 |
| WO | WO-2007/123168 | 11/2007 |
| WO | WO-2008/026451 | 3/2008 |

OTHER PUBLICATIONS

Japanese Notification of Reasons for Refusal mailed Apr. 8, 2011 directed towards corresponding Japanese Patent Application No. 2006-072957; 6 pages.

International Search Report, mailed on Sep. 26, 2006, directed to counterpart International Application No. PCT/JP2006/313597. 5 pages.

Chinese Office Action mailed Dec. 18, 2009, directed to counterpart Chinese Application No. 2006800259433; 11 pages.

Hirose, U.S. Office Action mailed May 4, 2010, directed to related U.S. Appl. No. 11/995,311; 11 pages.

International Search Report mailed Jun. 5, 2007, directed to International Application No. PCT/JP2007/058757; 1 page.

Japanese Office Action mailed Jan. 22, 2008, directed to Japanese Application No. 2007-227773; 3 pages.

Chinese Office Action mailed Apr. 22, 2010, directed to Chinese Application No. 200780033122.9; 13 pages.

Taiwanese Office Action dated Oct. 28, 2010, directed to Taiwanese Application No. 096114786; 6 pages.

Korean Notice to Submit a Response dated Mar. 30, 2011, directed to Korean Application No. 10-2009-7004682; 6 pages.

Chinese Decision on Rejection dated Apr. 15, 2011, directed to Chinese Application No. 200780033122.9; 16 pages.

Malaysian Substantive Examination Adverse Report dated Dec. 15, 2011, directed to Malaysian Application No. PI 20080065; 3 pages.

Fukuda et al., U.S. Office Action mailed Nov. 8, 2011, directed to U.S. Appl. No. 12/439,992; 11 pages.

International Search Report mailed Jun. 5, 2007, directed to International Application No. PCT/JP2007/058758; 1 page.

International Search Report mailed Mar. 11, 2008, directed to International Application No. PCT/JP2007/072852; 4 pages.

International Search Report mailed Jun. 2, 2009, directed to International Patent Application No. PCT/JP2009/053481; 3 pages.

Taiwanese Office Action dated Aug. 20, 2009, directed to Taiwanese Application No. 096114785; 9 pages.

Japanese Office Action mailed Jan. 22, 2010, directed to Japanese Application No. 2007-112032; 3 pages.

Japanese Notification of Reasons for Refusal mailed Jul. 22, 2010, directed at foreign application No. JP-2008-063034; 6 pages.

Korean Office Action dated Mar. 30, 2011, directed to Korean Application No. 10-2009-7004683; 7 pages.

Fukuda, T. et al., U.S. Office Action mailed Jun. 2, 2011, directed to U.S. Appl. No. 12/440,003; 7 pages.

Notification of First Office Action dated May 2, 2012, directed to Chinese Application No. 200910178370.3; 9 pages.

Chinese Notification of First Office Action dated Dec. 19, 2011, directed to Chinese Application No. 200910178369.0; 21 pages.

Japanese Notification of Reasons for Refusal mailed Jan. 10, 2012, directed to Japanese Application No. 2007-006229; 6 pages.

Japanese Notification of Reasons for Refusal mailed Feb. 2, 2012, directed to Japanese Application No. 2007-006224; 6 pages.

Notification of First Office Action dated Mar. 28, 2012, directed to Chinese Application No. 201110049758.0; 13 pages.

Fukuda et al., Office Action dated Apr. 26, 2012, directed to U.S. Appl. No. 12/439,992; 11 pages.

Taiwanese Office Action mailed Sep. 7, 2011, directed to Taiwanese Application No. 096146036; 14 pages.

Fukuda, T. et al., U.S. Office Action mailed Nov. 16, 2011 directed to U.S. Appl. No. 12/519,339; 8 pages.

Japanese Office Action mailed Jan. 22, 2008, directed to Japanese Application No. 2007-112032; 3 pages.

Hirose et al., U.S. Office Action mailed Aug. 20, 2012, directed to U.S. Appl. No. 12/864,819; 14 pages.

Fukuda et al., U.S. Office Action dated Oct. 4, 2012, directed to U.S. Appl. No. 12/439,992; 9 pages.

Office Action dated Sep. 4, 2012, directed to Taiwanese Application No. 098106388; 8 pages.

* cited by examiner

LAYERED SHEETS AND PROCESSES FOR PRODUCING THE SAME

CROSS-REFERENCE TO RELATED APPLICATIONS

This application is a divisional application of U.S. Ser. No. 11/995,311, filed Jan. 10, 2008, which is a national stage application under 35 USC 371 of International Application No. PCT/JP2006/313597, filed Jul. 7, 2006, which claims priority from Japanese Patent Application Nos. 2005-206950, filed Jul. 15, 2005, 2006-072873, filed Mar. 16, 2006, 2006-072907, filed Mar. 16, 2006, 2006-072945, filed Mar. 16, 2006, and 2006-072957, filed Mar. 16, 2006, the disclosures of which are incorporated herein by reference.

FIELD OF THE INVENTION

The present invention relates to a layered sheet (a holding sheet and a backing sheet) used for holding and fixing optical materials such as lenses and reflecting mirrors, semiconductor wafers such as silicon wafers, glass substrates, metal substrates, disks, etc., to a polishing head when polishing the surfaces thereof, a layered sheet (pressure-sensitive adhesive sheet) used for holding or protecting semiconductor products such as semiconductor wafers, optical products, etc., in the step of precise processing the products, and a process for producing the same.

BACKGROUND OF THE INVENTION

Typical examples of materials requiring high surface flatness include a single crystal silicon disk referred to as a silicon wafer for manufacturing semiconductor integrated circuits (IC, LSI). The silicon wafer is required to have a finished flat surface with high accuracy in each of steps of laminating and forming an oxide layer and a metal layer in order to form the reliable semiconductor junction of various thin films used for forming circuits in the steps of producing an IC, LSI, etc. In the polishing and finishing steps, a polishing pad is generally stuck to a rotatable support disk referred to as a platen, and a material to be polished such as a silicon wafer is stuck to a polishing head.

As a method for fixing a material to be polished such as a silicon wafer and glass to a polishing head, there have been conventionally adopted (1) a wax mounting method for fixing a polishing head and a material to be polished via wax, (2) a vacuum chuck method for fixing a material to be polished to a polishing head by suction, and (3) a no-wax mounting method for fixing a material to be polished by an artificial leather or polymer foaming sheet stuck to a polishing head.

In the wax mounting method, there is a problem that the material to be polished is unlikely to be attached and detached, the wax should be removed by cleaning the material to be polished after polishing, and thus the operating steps are complicated since the wax is used.

The vacuum chuck method has a problem that the material to be polished transforms in a suction port part and thereby the surface accuracy of the material to be polished after polishing is deteriorated.

The no-wax mounting method has advantages of easy attachment and detachment of the material to be polished and excellent production efficiency. However, the method has a problem that the surface smoothness of the material to be polished after polishing is also deteriorated when the surface accuracy of the holding surfaces of the artificial leather and polymer foaming sheet is poor.

The use of a backing material which is provided with an adhesive resin layer made of a resin on the surface of a foamed layer has been proposed as a method for solving the problem of the no-wax mounting method in JP-A 2002-355754. A sheet-shaped elastic foam, in which independent cells having an elongated shape and a larger diameter toward the surface of a foamed layer are provided for a foamed layer, has been proposed in JP-A 6-23664.

However, in a process for producing the backing material as presented in JP-A 2002-355754, the operating steps are complicated since the adhesive resin layer are separately provided and an elastic layer is produced by wet coagulation. Also, the process has problems of high environmental burden since a solvent has to be used and necessity of a large amount of water for the extraction of the solvent in the production. It is difficult to form the above cells according to JP-A 6-23664, and furthermore, it is considered that the modification of the foamed layer is increased since the void rate of the surface of the foamed layer is increased, thereby deteriorating the surface smoothness of the material to be polished after polishing. The process has problems that air bite occurs when the material to be polished is stuck to the foamed layer and a water film of slurry occurs between the foamed layer and the material to be polished since the water-absorbing property is low to reduce the adsorptive property of the material to be polished.

SUMMARY OF THE INVENTION

Provided herein is a process for producing a layered sheet. The process involves preparing a cell dispersed urethane composition by a mechanical foaming method. The cell dispersed urethane composition is applied to a base material sheet and cured to produce a polyurethane foam layer of uniform thickness. A releasing sheet may be utilized to make the thickness of the polyurethane foamed layer uniform.

Also provided herein is a layered sheet produced by the above process. The polyurethane foamed layer may have spherical fine cells having an average cell diameter of 20 to 300 μm. The polyurethane foamed layer may have a specific gravity of 0.2 to 0.5. The polyurethane foamed layer may also have a Asker C hardness of 10 to 50 degrees.

DETAILED DESCRIPTION OF THE INVENTION

Figure 1:
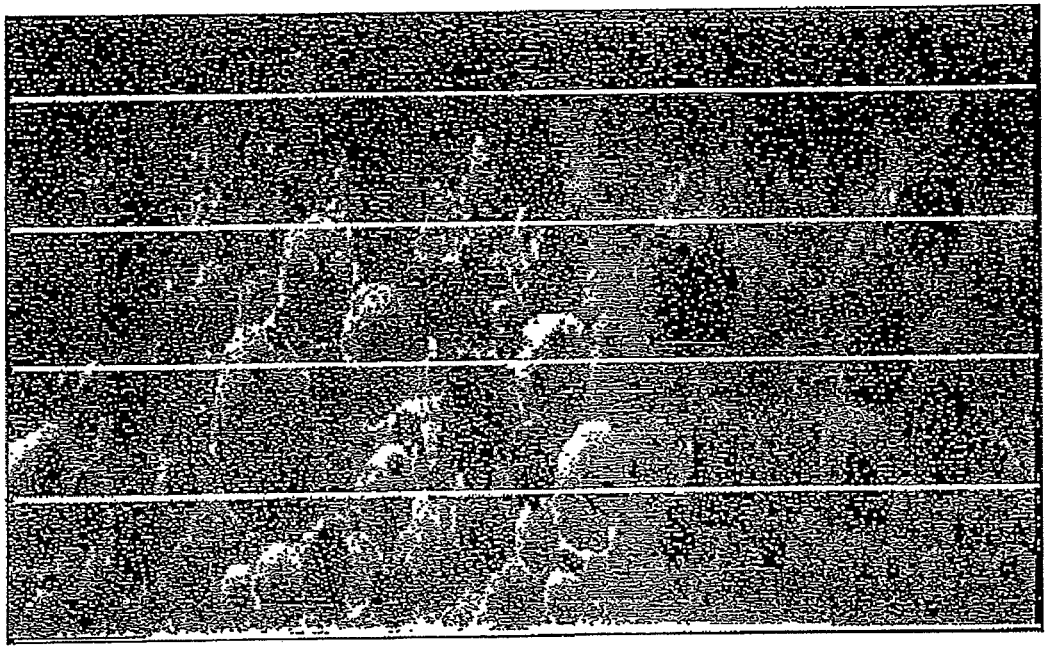
FIG. 1 is a photomicrograph (SEM photograph) of a polyurethane foamed layer of a layered sheet in Example 1.

Various embodiments, aspects and modes of the invention will be described as follows. A first aspect of the invention is to provide a process for extremely easily producing a layered sheet which has a holding surface having high surface accuracy. A second aspect of the invention is to provide a process for extremely easily producing a layered sheet which has a holding surface having high surface accuracy and has the excellent property of adsorptively holding a material to be polished. A third aspect of the invention is to provide a layered sheet which has a holding surface having surface accuracy and has the excellent property of adsorptively holding a material to be polished, and a process for producing the same. A fourth aspect of the invention is to provide a layered sheet which has the excellent property of adsorptively holding a material to be polished and has excellent durability.

The present inventors made extensive study to solve the problem described above, and as a result, they found that the various aspects of the invention can be achieved by the following layered sheet and process for producing the same.

A first aspect of the invention relates to a process for producing a layered sheet including the steps of: preparing a cell dispersed urethane composition by a mechanical foaming method; applying the cell dispersed urethane composition onto a base material sheet; forming a polyurethane foamed layer by curing the cell dispersed urethane composition; and regulating a thickness of the polyurethane foamed layer uniformly.

Another first aspect of the invention relates to a process for producing a layered sheet including the steps of: preparing a cell dispersed urethane composition by a mechanical foaming method; applying the cell dispersed urethane composition onto a base material sheet; laminating a release sheet on the cell dispersed urethane composition; forming a polyurethane foamed layer by curing the cell dispersed urethane composition while making the thickness thereof uniform with a pressing means; and releasing the release sheet on the polyurethane foamed layer.

As described above, a gas such as air is dispersed as fine cells in a starting material by the mechanical foaming method to prepare the cell dispersed urethane composition. Then, the cell dispersed urethane composition is cured, and thereby the polyurethane foamed layer having an extremely small cell diameter and having spherical cells (including roughly spherical cells) can be extremely easily formed. In the mechanical foaming method of the present invention, a gas such as air is dispersed, without being dissolved, in the starting material, and thus there is an advantage that generation of new cells (post-expansion phenomenon) after a step of uniformly regulating a thickness of the polyurethane foamed layer can be suppressed and the accuracy of a thickness and specific gravity can be easily controlled. In addition, the mechanical foaming method does not necessitate use of a solvent, and is not only excellent in costs but is also preferable from an environmental viewpoint. In the polyurethane foamed layer, a holding surface holding a material to be polished has extremely high surface accuracy, and the surface smoothness of a material to be polished after polishing is extremely excellent when the material to be polished is held using the layered sheet having the foamed layer. The polyurethane foamed layer has spherical cells, and thus has excellent durability. Accordingly, when the material to be polished is polished with the layered sheet having the foamed layer, polishing rate stability is improved.

A layered sheet of the first aspect of the invention is obtained by the production process.

The polyurethane foamed layer preferably has spherical fine cells having an average cell diameter of 20 to 300 μm.

The polyurethane foamed layer preferably has an average cell diameter difference (a maximum value of the average cell diameter–a minimum value of the average cell diameter) of 50 μm or less in a thickness direction. When variance in the cell diameter is large in the thickness direction of the polyurethane foamed layer, an area having a low resin density has durability inferior to that of the other area, and the area easily causes the thickness change (settling phenomenon). As a result, the surface accuracy of the holding surface holding the material to be polished tends to be reduced, and the surface smoothness of the material to be polished after polishing tends to be also reduced. In addition, the polishing rate stability tends to be deteriorated. When the average cell diameter difference in the thickness direction is 50 μm or less, the thickness change of the polyurethane foamed layer can be effectively suppressed.

The polyurethane foamed layer preferably has a specific gravity of 0.2 to 0.5. In addition, the polyurethane foamed layer preferably has an Asker C hardness of 10 to 50 degrees. Furthermore, the polyurethane foamed layer preferably has a compression rate of 2 to 10%.

A second aspect of the invention relates to a process for producing a layered sheet including the steps of: preparing a cell dispersed urethane composition by a mechanical foaming method; applying the cell dispersed urethane composition onto a base material sheet; laminating a release sheet having a nitrogen gas permeation rate of $1\times10^{-7}$ [$cm^3/cm^2 \cdot s \cdot cmHg$] or less on the applied cell dispersed urethane composition; and forming a polyurethane foamed layer having interconnected cells by curing the cell dispersed urethane composition while making the thickness thereof uniform with a pressing means.

As described above, a gas such as air is dispersed as fine cells in a starting material by the mechanical foaming method to prepare the cell dispersed urethane composition. Then, the cell dispersed urethane composition is cured, and thereby the polyurethane foamed layer having an extremely small cell diameter and having spherical cells (including roughly spherical cells) can be extremely easily formed. In the mechanical foaming method of the present invention, a gas such as air is dispersed, without being dissolved, in the starting material, and thus there is an advantage that generation of new cells (post-expansion phenomenon) after a step of uniformly regulating a thickness of the polyurethane foamed layer can be suppressed and accuracy of a thickness and specific gravity can be easily controlled. In addition, the mechanical foaming method does not necessitate use of a solvent, and is not only excellent in costs but is also preferable from an environmental viewpoint.

Furthermore, in the production process of the second aspect of the invention, the release sheet having a nitrogen gas permeation rate of $1\times10^{-7}$ [$cm^3/cm^2 \cdot s \cdot cmHg$] or less is laminated on the applied cell dispersed urethane composition. Thereby, when the fine cells in the cell dispersed urethane composition are broken to form interconnected cells, a gas in the fine cells can be held in the composition, and the gas can be prevented from being discharged to the outer atmosphere. Accordingly, the change of the thickness of the cell dispersed urethane composition in the curing step can be suppressed, and the surface accuracy of the polyurethane foamed layer after being cured can be enhanced.

In the second aspect of the invention, the base material sheet preferably has a nitrogen gas permeation rate of $1\times10^{-7}$ [$cm^3/cm^2 \cdot s \cdot cmHg$] or less. The above effect is further improved by using the base material sheet.

In the second aspect of the invention, it is preferable that the base material sheet is a polyethylene terephthalate (PET) film and the release sheet is a polyethylene terephthalate film subjected to release treatment. The PET film is particularly a suitable material since the PET film has a low nitrogen gas permeation rate.

A layered sheet of the second aspect of the invention is obtained by the production process. Since the polyurethane foamed layer of the layered sheet of the present invention has spherical interconnected cells (including oval spherical interconnected cells), the polyurethane foamed layer can discharge air to the outside via the interconnected cells even if air biting is generated when the material to be polished is stuck to the polyurethane foamed layer. Accordingly, the material to be polished can be stuck to the polyurethane foamed layer with high flatness. Since slurry can be absorbed into the polyurethane foamed layer via the interconnected cells even when the slurry enters between the foamed layer and the material to be polished, the generation of the water film of the slurry between the foamed layer and the material to be polished can be prevented. Therefore, the reduction of the adsorptive property of the material to be polished can be effectively prevented. In the polyurethane foamed layer, a holding surface holding the material to be polished has extremely high surface accuracy, and thereby the surface smoothness of the material to be polished after polishing is extremely excellent when the material to be polished is held using the layered sheet having the foamed layer. Since the polyurethane foamed layer has spherical cells, the polyurethane foamed layer has excellent durability. Therefore, when the material to be polished is polished by using the layered sheet having the foamed layer, the polishing rate stability is enhanced.

The polyurethane foamed layer may contain interconnected cells and independent cells. However, the interconnected cell rate of the polyurethane foamed layer is 50% or more, and preferably 65% or more.

An average cell diameter of the interconnected cells of the polyurethane foamed layer is preferably 20 to 300 μm. The polyurethane foamed layer preferably has a specific gravity of 0.2 to 0.5. The polyurethane foamed layer preferably has an Asker C hardness of 10 to 50 degrees. The polyurethane foamed layer preferably has a compression rate of 2 to 10%.

A layered sheet of a third aspect of the invention comprises a base material sheet and a polyurethane foamed layer, wherein the polyurethane foamed layer has spherical interconnected cells, and each of the interconnected cells has a surface in which circular holes are formed.

Since the polyurethane foamed layer of the layered sheet of the third aspect of the invention has spherical interconnected cells (including roughly spherical interconnected cells) having a cell surface in which circular holes (including roughly circular holes) are formed, the polyurethane foamed layer can discharge air to the outside via the interconnected cells even if air biting is generated when the material to be polished is stuck to the polyurethane foamed layer. Therefore, the material to be polished can be stuck with high flatness on the polyurethane foamed layer. Since slurry can be absorbed into the polyurethane foamed layer via the interconnected cells even when the slurry enters between the foamed layer and the material to be polished, the generation of the water film of the slurry between the foamed layer and the material to be polished can be prevented. Therefore, the reduction of the adsorptive property of the material to be polished can be effectively prevented.

It is preferable that an average cell diameter of the interconnected cells is 20 to 300 μm and an average diameter of the circular holes is 100 μm or less. When the average cell diameter is less than 20 μm, the foamed layer hardly absorbs the slurry, and the water film of the slurry tends to be easily generated between the foamed layer and the material to be polished. On the other hand, since the surface smoothness of the foamed layer is deteriorated and the variance in local compression characteristics is easily generated when the average cell diameter is more than 300 μm, the surface smoothness of the material to be polished after polishing tends to be deteriorated. When the average diameter of the circular hole is more than 100 μm, the change of compression characteristics due to water absorption of the foamed layer tends to be generated, and the surface smoothness of the material to be polished after polishing tends to be deteriorated.

The polyurethane foamed layer may contain the interconnected cells and independent cells. However, the interconnected cell rate of this polyurethane foamed layer is preferably 50% or more, and more preferably 65% or more.

It is preferable that the polyurethane foamed layer contains an isocyanate component and an active hydrogen-containing compound as a starting material component and the active hydrogen-containing compound contains 60 to 85 wt % of a high-molecular-weight polyol having 2 to 4 functional groups and a hydroxy value of 20 to 100 mg KOH/g. The interconnected cells as an object can be stably formed by using the specific amount of the polymer polyol and the mechanical characteristics of the foamed layer are enhanced.

It is preferable that the polyurethane foamed layer contains an isocyanate component and an active hydrogen-containing compound containing a high-molecular-weight polyol as a starting material component and the high-molecular-weight polyol contains 20 to 100 wt % of a polymer polyol containing polymer particles made of acrylonitrile and/or a styrene-acrylonitrile copolymer. The cell film is easily broken by the filler effect of the polymer particles, and the interconnected cells as an object can be easily formed.

The active hydrogen-containing compound preferably contains 2 to 15 wt % of a low-molecular-weight polyol having a hydroxy value of 400 to 1830 mg KOH/g and/or low-molecular-weight polyamine having an amine value of 400 to 1870 mg KOH/g. The interconnected cells as an object can be stably formed by using the specific amount of the low-molecular-weight polyol and/or low-molecular-weight polyamine, and the mechanical characteristics of the foamed layer is enhanced. In using the low-molecular-weight polyol and the low-molecular-weight polyamine together, the low-molecular-weight polyol and low-molecular-weight polyamine of 2 to 15 wt % are used in total.

A process for producing a layered sheet of the third aspect of the invention comprises the steps of: preparing a cell dispersed urethane composition containing an isocyanate component and an active hydrogen-containing compound containing 60 to 85 wt % of a high-molecular-weight polyol having 2 to 4 functional groups and a hydroxy value of 20 to 100 mg KOH/g as a starting material component by a mechanical foaming method; applying the cell dispersed urethane composition onto a base material sheet; forming a polyurethane foamed layer having spherical interconnected cells with surfaces in which circular holes are formed by curing the cell dispersed urethane composition; and regulating a thickness of the polyurethane foamed layer uniformly.

Another process for producing a layered sheet of the third aspect of the invention comprises the steps of: preparing a cell dispersed urethane composition containing an isocyanate component and an active hydrogen-containing compound containing 60 to 85 wt % of a high-molecular-weight polyol having 2 to 4 functional groups and a hydroxy value of 20 to 100 mg KOH/g as a starting material component by a mechanical foaming method; applying the cell dispersed urethane composition onto a base material sheet; laminating a release sheet on the cell dispersed urethane composition; forming a polyurethane foamed layer having spherical interconnected cells with surfaces in which circular holes are formed by curing the cell dispersed urethane composition; and releasing the release sheet on the polyurethane foamed layer.

Yet another process for producing a layered sheet of the third aspect of the invention comprises the steps of: preparing a cell dispersed urethane composition containing an isocyanate component and an active hydrogen-containing compound containing a polymer polyol containing polymer particles made of acrylonitrile and/or a styrene-acrylonitrile copolymer as a starting material component by a mechanical foaming method; applying the cell dispersed urethane composition onto a base material sheet; forming a polyurethane foamed layer having spherical interconnected cells with surfaces in which circular holes are formed by curing the cell dispersed urethane composition; and regulating a thickness of the polyurethane foamed layer uniformly.

Further another process for producing a layered sheet of the third aspect of the invention comprises the steps of: preparing a cell dispersed urethane composition containing an isocyanate component and an active hydrogen-containing compound containing a polymer polyol containing polymer particles made of acrylonitrile and/or a styrene-acrylonitrile copolymer as a starting material component by a mechanical foaming method; applying the cell dispersed urethane composition onto a base material sheet; laminating a release sheet on the cell dispersed urethane composition; forming a polyurethane foamed layer having spherical interconnected cells with surfaces in which circular holes are formed by curing the cell dispersed urethane composition while making the thickness thereof uniform with a pressing means; and releasing the release sheet on the polyurethane foamed layer.

As described above, a gas such as air is dispersed as fine cells in a starting material by the mechanical foaming method to prepare the cell dispersed urethane composition. Then, the cell dispersed urethane composition is cured, and thereby the polyurethane foamed layer having spherical interconnected cells (including roughly spherical interconnected cells) which have a small cell diameter and have surfaces in which the circular holes (including the roughly circular holes) are formed can be easily formed. In the mechanical foaming method of the present invention, a gas such as air is dispersed without being dissolved in the starting material, and thus there is an advantage that generation of new cells (post-expansion phenomenon) after a step of uniformly regulating a thickness of the polyurethane foamed layer can be suppressed and the accuracy of a thickness and specific gravity can be easily controlled. In addition, the mechanical foaming method does not necessitate use of a solvent, and is not only excellent in costs but is also preferable from an environmental viewpoint. Since the polyurethane foamed layer has spherical interconnected cells (including oval spherical interconnected cells) with surfaces in which the circular holes (including the roughly circular holes) are formed, the polyurethane foamed layer can discharge air to the outside via the interconnected cells even if air biting is generated when the material to be polished is stuck to the polyurethane foamed layer. Accordingly, the material to be polished can be stuck to the polyurethane foamed layer with high flatness. Since slurry can be absorbed into the polyurethane foamed layer via the interconnected cells even when the slurry enters between the foamed layer and the material to be polished, the generation of the water film of the slurry between the foamed layer and the material to be polished can be prevented. Therefore, the reduction of the adsorptive property of the material to be polished can be effectively prevented. Since the interconnected cells of the polyurethane foamed layer are spherical, the polyurethane foamed layer has excellent durability. Therefore, when the material to be polished is polished by using the layered sheet having the foamed layer, the polishing rate stability is enhanced.

The third aspect of the invention relates to a layered sheet produced by the process. It is preferable that an average cell diameter of the interconnected cells of the polyurethane foamed layer is 20 to 300 μm and an average diameter of the circular holes is 100 μm or less by the same reason as the above.

A fourth aspect of the invention relates to a layered sheet including: a base material sheet; and a polyurethane foamed layer, wherein the polyurethane foamed layer has oval cells having a long axis parallel to a thickness direction of the polyurethane foamed layer, and a ratio (L/S) of the average major axis L and average minor axis S of the oval cells in a section of the polyurethane foamed layer is 1.5 to 3.

The present inventors found that the cells in the polyurethane foamed layer is changed to the oval cells (the oval spherical cells, may not be strictly balanced spherical cells) from the conventional cells and the long axis of each of the oval cells is arranged in parallel (substantially parallel) to the thickness direction of the foamed layer, thereby enabling the enhancement in modulus of elasticity thereof as compared with the conventional polyurethane foamed layer and the suppression of the modification of the foamed layer. Since the layered sheet of the present invention has a holding surface having high surface accuracy, the holding surface holding the material to be polished, the surface smoothness of the material to be polished after polishing is excellent when the material to be polished is held by using the layered sheet. Since the layered sheet of the present invention has excellent durability, the polishing rate stability in polishing is enhanced when the material to be polished is held by using the layered sheet.

The cells in the polyurethane foamed layer may contain spherical cells. However, a numerical rate of the oval cells is preferably 30% or more of all the cells in order to sufficiently express effects as an object.

The oval cells are preferably interconnected cells. When the oval cells are the interconnected cells, the polyurethane foamed layer can discharge air to the outside via the interconnected cells even if air biting is generated when the material to be polished is stuck to the polyurethane foamed layer. Accordingly, the material to be polished can be stuck to the polyurethane foamed layer with high flatness. Since slurry can be absorbed into the polyurethane foamed layer via the interconnected cells even when the slurry enters between the foamed layer and the material to be polished, the generation of the water film of the slurry between the foamed layer and the material to be polished can be prevented. Therefore, the reduction of the adsorptive property of the material to be polished can be effectively prevented.

The process for producing a layered sheet of the first aspect of the invention comprises the steps of: preparing a cell dispersed urethane composition by a mechanical foaming method; applying the cell dispersed urethane composition onto a base material sheet; forming a polyurethane foamed layer by curing the cell dispersed urethane composition; and regulating a thickness of the polyurethane foamed layer uniformly.

Another process for producing a layered sheet of the first aspect of the invention comprises the steps of: preparing a cell dispersed urethane composition by a mechanical foaming method; applying the cell dispersed urethane composition onto a base material sheet; laminating a release sheet on the cell dispersed urethane composition; forming a polyurethane foamed layer by curing the cell dispersed urethane composition while making the thickness thereof uniform with a pressing means; and releasing the release sheet on the polyurethane foamed layer.

The process for producing a layered sheet of a second aspect of the invention comprises the steps of: preparing a cell dispersed urethane composition by a mechanical foaming method; applying the cell dispersed urethane composition onto a base material sheet; laminating a release sheet having a nitrogen gas permeation rate of $1\times10^{-7}$ [$cm^3/cm^2 \cdot s \cdot cmHg$] or less on the applied cell dispersed urethane composition; and forming a polyurethane foamed layer having interconnected cells by curing the cell dispersed urethane composition while making the thickness thereof uniform with a pressing means.

The cell dispersed urethane composition may be prepared by a mechanical foaming method (including a mechanical frothing method), and is not particularly limited with respect to other aspects. For example, the cell dispersed urethane composition is prepared by the following methods.

(1) The first component wherein a silicon-based surfactant is added to an isocyanate-terminated prepolymer produced by an isocyanate component with a high-molecular-weight polyol or the like is mechanically stirred in the presence of an unreactive gas, to disperse the unreactive gas as fine cells thereby forming a cell dispersion. Then, the second component containing active hydrogen-containing compounds such as high-molecular-weight and low-molecular-weight polyols are added to, and mixed with, the cell dispersion to prepare a cell dispersed urethane composition. If necessary, a catalyst and a filler such as carbon black may be added to the second component.

(2) A silicon-based surfactant is added to the first component containing an isocyanate component (or an isocyanate-terminated prepolymer) and/or the second component containing active hydrogen-containing compounds, and the component(s) to which the silicon-based surfactant is added is mechanically stirred in the presence of an unreactive gas, to disperse the unreactive gas as fine cells thereby forming a cell dispersion. Then, the remaining component is added to, and mixed with, the cell dispersion to prepare a cell dispersed urethane composition.

(3) A silicon-based surfactant is added to at least either of the first component containing an isocyanate component (or an isocyanate-terminated prepolymer) or the second component containing active hydrogen-containing compounds, and the first and second components are mechanically stirred in the presence of an unreactive gas, to disperse the unreactive gas as fine cells thereby preparing a cell dispersed urethane composition.

Polyurethane is preferable as a forming material for the foamed layer of the layered sheet since spherical fine cells and interconnected cells can be easily formed by the mechanical foaming method.

The layered sheet of the third aspect of the invention comprises a base material sheet and a polyurethane foamed layer, wherein the polyurethane foamed layer has spherical interconnected cells, and each of the interconnected cells has a surface in which circular holes are formed.

The polyurethane foamed layer can be formed by, for example, curing a cell dispersed urethane composition prepared by a mechanical foaming method (including a mechanical frothing method) on a base material sheet. Specifically, the cell dispersed urethane composition is prepared by the method.

Polyurethane is preferable as a forming material for the foamed layer of the layered sheet, since spherical interconnected cells in which circular holes are formed on the surface of each of the cells can be easily formed by the mechanical foaming method.

The layered sheet of the fourth aspect of the invention comprises a base material sheet and a polyurethane foamed layer.

A polyurethane resin is preferable as a forming material for the foamed layer of the layered sheet since fine oval cells can be easily formed by the mechanical foaming method. The polyurethane resin comprises an isocyanate component, a polyol component (high-molecular-weight polyol and low-molecular-weight polyol or the like), and a chain extender.

As the isocyanate component, a compound known in the field of polyurethane can be used without particular limitation. The isocyanate component includes, for example, aromatic diisocyanates such as 2,4-toluene diisocyanate, 2,6-toluene diisocyanate, 2,2'-diphenyl methane diisocyanate, 2,4'-diphenyl methane diisocyanate, 4,4'-diphenyl methane diisocyanate, polymeric MDI, carbodiimide modified MDI (for example, Millionate MTL made by Nippon Polyurethane Industry Co., Ltd.), 1,5-naphthalene diisocyanate, p-phenylene diisocyanate, m-phenylene diisocyanate, p-xylylene diisocyanate and m-xylylene diisocyanate, aliphatic diisocyanates such as ethylene diisocyanate, 2,2,4-trimethyl hexamethylene diisocyanate and 1,6-hexamethylene diisocyanate, and cycloaliphatic diisocyanates such as 1,4-cyclohexane diisocyanate, 4,4'-dicyclohexyl methane diisocyanate, isophorone diisocyanate and norbornane diisocyanate. These may be used alone or as a mixture of two or more thereof.

As the isocyanate component, it is possible to use not only the above-described diisocyanate compounds but also multifunctional (trifunctional or more) polyisocyanates. As the multifunctional isocyanate compounds, a series of diisocyanate adduct compounds are commercially available as Desmodul-N (Bayer) and Duranate™ (Asahi Chemical Industry Co., Ltd.).

Among the isocyanate components described above, 4,4'-diphenylmethane diisocyanate or carbodiimide modified MDI is preferably used.

The active hydrogen-containing compound is a high-molecular-weight polyol, low-molecular-weight polyol, and a low-molecular-weight polyamine or the like which have active hydrogen reacted with the isocyanate component.

As the high-molecular-weight polyol, a compound known in the field of polyurethane can be used without particular limitation. The high-molecular-weight polyol includes, for example, polyether polyols represented by polytetramethylene ether glycol and polyethylene glycol, polyester polyols represented by polybutylene adipate, polyester polycarbonate polyols exemplified by reaction products of polyester glycols such as polycaprolactone polyol and polycaprolactone with alkylene carbonate, polyester polycarbonate polyols obtained by reacting ethylene carbonate with a multivalent alcohol and reacting the resulting reaction mixture with an organic dicarboxylic acid, polycarbonate polyols obtained by ester exchange reaction of a polyhydroxyl compound with aryl carbonate, and polymer polyols such as polyether polyol in which polymer particles are dispersed. These may be used singly or as a mixture of two or more thereof. To produce the polyurethane foamed layer having an independent cell structure, a polyether polyol is preferably only used.

To produce the polyurethane foamed layer having an interconnected cell structure, a polymer polyol is preferably used, and a polymer polyol in which polymer particles made of acrylonitrile and/or styrene-acrylonitrile copolymers are dispersed is particularly preferably used. This polymer polyol is contained in an amount of preferably 20 to 100 wt %, more preferably 30 to 60 wt %, in the whole polymer polyol used.

A high-molecular-weight polyol having 2 to 4 functional groups and a hydroxy value of 20 to 100 mg KOH/g is preferably used. The hydroxy value is more preferably 25 to 60 mg KOH/g. The number of the functional groups of 5 or more tends to cause excessively high crosslinking degree of a polyurethane foam to reduce the adsorptive property of the material to be polished. The hydroxy value of less than 20 mg KOH/g tends to decrease the amount of hard segments of polyurethane to reduce the durability of the polyurethane foam. The hydroxy value of more than 100 mg KOH/g tends to cause excessively high crosslinking degree of the polyurethane foam to reduce the adsorptive property of the material to be polished.

These specific high-molecular-weight polyols of 60 to 85 wt % are preferably contained in the active hydrogen-containing compound, and more preferably 70 to 80 wt %. A cell film is easily broken by using a specific amount of the specific high-molecular-weight polyol, and an interconnected cell structure is easily formed.

A number-average molecular weight of the high-molecular-weight polyol is not particularly limited, but is preferably 1500 to 6000, from the viewpoint of the elastic characteristics of the resulting polyurethane. When the number-average molecular weight is less than 1500, the polyurethane obtained therefrom does not have sufficient elastic characteristics, thus easily becoming a brittle polymer. Accordingly, a foamed layer made of this polyurethane is rigid to reduce the holding property of the material to be polished. On the other hand, when the number-average molecular weight is higher than 6000, polyurethane obtained therefrom becomes too soft. Therefore, a foamed layer made of this polyurethane tends to be inferior in durability.

Examples of the low-molecular-weight polyol that can be used together with a high-molecular-weight polyol described above include: ethylene glycol, 1,2-propylene glycol, 1,3-propylene glycol, 1,4-butanediol, 1,6-hexanediol, neopentyl glycol, 1,4-cyclohexanedimethanol, 3-methyl-1,5-pentanediol, diethylene glycol, triethyleneglycol, 1,4-bis(2-hydroxyethoxy)benzene and the like. Other examples that can be used together with the high-molecular-weight polyol also include: low-molecular-weight polyamine such as ethylenediamine, tolylenediamine, diphenylmethanediamine, diethylenetriamine and the like. These low-molecular-weight polyols, low-molecular-weight polyamines may be used alone or as a mixture of two or more thereof.

To form the polyurethane foamed layer having an interconnected cell structure, among these compounds, a low-molecular-weight polyol having a hydroxyl value of 400 to 1830 mg KOH/g and/or a low-molecular-weight polyamine having an amine value of 400 to 1870 mg KOH/g are preferably used. The hydroxyl value is more preferably 700 to 1250 mg KOH/g, and the amine value is more preferably 400 to 950 mg KOH/g. When the hydroxyl value is less than 400 mg KOH/g or the amine value is less than 400 mg KOH/g, an effect of improving formation of interconnected cells tends to be not sufficiently obtained. On the other hand, when the hydroxyl value is greater than 1830 mg KOH/g or the amine value is greater than 1870 mg KOH/g, it tends to decrease the distance of between hard segments of polyurethane to reduce the adsorptive property of the material to be polished. Particularly, diethylene glycol, triethylene glycol or 1,4-butanediol is preferably used.

The ratio of the high-molecular-weight polyol and low-molecular-weight polyol or the like is determined according to characteristics necessitated for the polyurethane foamed layer manufactured therefrom.

To form the polyurethane foamed layer having an interconnected cell structure, the low-molecular-weight polyol and/or the low-molecular-weight polyamine are contained in the total amount of preferably 2 to 15 wt %, more preferably 5 to 10 wt %, in the active hydrogen-containing compound. By using the low-molecular-weight polyol etc. in specified amounts, cell films are easily broken to easily form an interconnected cell structure and further the mechanical characteristics of the polyurethane foamed layer are improved.

In the case where a polyurethane is produced by means of a prepolymer method, a chain extender is used in curing of a prepolymer. A chain extender is an organic compound having at least two active hydrogen groups and examples of the active hydrogen group include: a hydroxyl group, a primary or secondary amino group, a thiol group (SH) and the like. Concrete examples of the chain extender include: polyamines such as 4,4'-methylenebis(o-chloroaniline) (MOCA), 2,6-dichloro-p-phenylenediamine, 4,4'-methylenebis(2,3-dichloroaniline), 3,5-bis(methylthio)-2,4-toluenediamine, 3,5-bis(methylthio)-2,6-toluenediamine, 3,5-diethyltoluene-2,4-diamine, 3,5-diethyltoluene-2,6-diamine, trimethylene glycol-di-p-aminobenzoate, polytetramethylene oxide-di-p-aminobenzoate, 4,4'-diamino-3,3',5,5'-tetraethyldiphenylmethane, 4,4'-diamino-3,3'-diisopropyl-5.5'-dimethyldiphenylmethane, 4,4'-diamino-3,3',5,5'-tetraisopropyldiphenylmethane, 1,2-bis(2-aminophenylthio)ethane, 4,4'-diamino-3,3'-diethyl-5.5'-dimethyldiphenylmethane, N,N'-di-sec-butyl-4,4'-diaminophenylmethane, 3,3'-diethyl-4,4'-diaminodiphenylmethane, m-xylylenediamine, N,N'-di-sec-butyl-p-phenylenediamine, m-phenylenediamine and p-xylylenediamine; low-molecular-weight polyol component; and a low-molecular-weight polyamine component. The chain extenders described above may be used either alone or in mixture of two kinds or more.

The average hydroxy value (OHVav) of the active hydrogen-containing compound used in the second and third aspect of the inventions is preferably within the range of the following equation.

$$(350-80 \times fav - 120/fav) \leq OHVav \leq (350-80 \times fav + 120/fav)$$

In the above equation, OHVav and fav (the number of the average functional groups) are calculated by the following equation.

$$OHVav = \sum_{i=1}^{n}(ai \times ci) \Big/ \sum_{i=1}^{n} ci \quad \text{[Equation 1]}$$

$$fav = \sum_{i=1}^{n}(bi \times ci) \Big/ \sum_{i=1}^{n} ci \quad \text{[Equation 2]}$$

In the above equation, n represents the number of the polyol components; $ai$ represents the hydroxy value; $bi$ represents the number of the functional groups; and $ci$ represents addition part by weight.

For example, when the active hydrogen-containing compound to be used is a first to a n-th polyol components, the hydroxy value of the first polyol component is defined as $a1$; the number of functional groups is defined as $b1$, the addition weight part is defined as $c1$ •••; the hydroxy value of the n-th polyol component is defined as $an$; the number of the functional groups is defined as $bn$; and the addition weight part is defined as $cn$. However, since referring to the polymer polyol, the polymer particles are dispersed, the number of the functional groups is calculated as 3 even in any of kinds.

When polyurethane is produced by a prepolymer method in the second and third aspects of the invention, the kind and compounding rate of the active hydrogen-containing compound used in synthesizing and curing an isocyanate-terminated-prepolymer are not particularly limited. However, in synthesizing the isocyanate-terminated-prepolymer, it is preferable that the high-molecular-weight polyol of 80 wt % or more is used in the active hydrogen-containing compound, and the low-molecular-weight polyol and/or low-molecular-weight polyamine of 80 wt % or more are used in the active hydrogen-containing compound in curing the isocyanate-terminated-prepolymer. The proper use of the active hydrogen-containing compound is a desirable method in terms of the stability of the physical characteristics and productivity of polyurethane to be obtained.

A ratio between an isocyanate component, a polyol component and a chain extender in the invention can be altered in various ways according to molecular weights thereof, desired physical properties of polyurethane foamed layer and the like. In order to obtain a foamed layer with desired polishing characteristics, a ratio of the number of isocyanate groups in an isocyanate component relative to a total number of active hydrogen groups (hydroxyl groups+amino groups) in a polyol component and a chain extender is preferably in the range of from 0.80 to 1.20 and more preferably in the range of from 0.99 to 1.15. When the number of isocyanate groups is outside the aforementioned range, there is a tendency that curing deficiency is caused, required cell, specific gravity, hardness and compressibility are not obtained.

The isocyanate-terminated prepolymer is preferably a prepolymer having a molecular weight of about 1000 to 10000, more preferably 1000 to 5000 because of its excellent workability, physical properties etc. When the prepolymer is solid at an ordinary temperature, the prepolymer is melted by preheating at a suitable temperature prior to use.

The silicon-based surfactant includes, for example, a surfactant containing polyalkylsiloxane/polyether copolymer. Such silicon-based surfactant can be exemplified by SH-192 and L-5340 (made by Toray Dow Corning Silicone Co., Ltd.) as preferable compounds.

Various additives may be mixed; such as a stabilizer including an antioxidant, a lubricant, a pigment, a filler, an antistatic agent and others.

The unreactive gas used for forming fine bubbles is preferably not combustible, and is specifically nitrogen, oxygen, a carbon dioxide gas, a rare gas such as helium and argon, and a mixed gas thereof, and the air dried to remove water is most preferable in respect of cost.

As a stirring device for dispersing an unreactive gas in a fine-cell state, any known stirring deices can be used without particular limitation, and specific examples include a homogenizer, a dissolver, a twin-screw planetary mixer, a mechanical froth foaming machine etc. The shape of a stirring blade of the stirring device is not particularly limited, and a whipper-type stirring blade is preferably used to form fine cells. For obtaining the intended polyurethane foamed layer, the number of revolutions of the stirring blade is preferably 500 to 2000 rpm, more preferably 800 to 1500 rpm. The stirring time is suitably regulated depending on the intended density.

In a preferable mode, different stirring devices are used for preparing a cell dispersion in the foaming process and for stirring the first and the second components to mix them, respectively. Stirring in the mixing step may not be stirring for forming cells, and a stirring device not generating large cells is preferably used in the mixing step. Such a stirring device is preferably a planetary mixer. The same stirring device may be used in the foaming step of preparing a cell dispersion and in the mixing step of mixing the respective components, and stirring conditions such as a revolution rate of the stirring blade are preferably regulated according to necessary.

Then, the cell dispersed urethane composition prepared by the method described above is applied onto a base material sheet, and then the cell dispersed urethane composition is cured to form a polyurethane foamed layer.

The forming material for the base material sheet is not particularly limited. Examples thereof include polyethylene terephthalate, polyester, polyethylene, polypropylene, polystyrene, polyimide, polyvinyl alcohol, polyvinyl chloride, a fluorine-containing resin such as polyfluoroethylene, nylon and cellulose.

In the first and third aspects of the invention, the thickness of the base material sheet is not limited. However, the thickness is preferably about 0.05 to about 0.3 mm in terms of the strength and flexibility or the like thereof.

The base material sheet used in the second aspect of the invention preferably has a nitrogen gas permeation rate of $1\times10^{-7}$ [$cm^3/cm^2 \cdot s \cdot cmHg$] or less, and more preferably $1\times10^{-8}$ [$cm^3/cm^2 \cdot s \cdot cmHg$] or less. Examples of the forming materials satisfying these conditions include polyethylene terephthalate, polypropylene and polyethylene.

In the second aspect of the invention, the thickness of the base material sheet is not particularly limited. However, the thickness is preferably 0.025 to 0.3 mm, and more preferably 0.05 to 0.2 mm in terms of the suppression of permeation of gas included in the polyurethane foamed layer, and the strength and flexibility of the base material sheet.

A method of applying the cell dispersed urethane composition onto the base material sheet can make use of coating methods using, for example, roll coaters such as a gravure coater, kiss-roll coater and comma coater, die coaters such as a slot coater and fountain coater, and a squeeze coater, a curtain coater etc., and any methods can be used insofar as a uniform coating film can be formed on the base material sheet.

Post cure by heating the polyurethane foam, formed by applying the cell dispersed urethane composition onto the base material sheet and then reacting the composition until it does not flow, has an effect of improving physical properties of the polyurethane foam and is thus extremely preferable. Post cure is carried out preferably at 40 to 70° C. for 10 to 60 minutes and conducted preferably at a normal pressure in order to stabilize the shape of cells.

In the production of the polyurethane foamed layer, known catalysts promoting a polyurethane reaction, such as tertiary amine-based catalysts, may be used. The type and amount of the catalyst added are determined in consideration of flow time for application onto a base material sheet after the step of mixing the respective components.

Production of the polyurethane foamed layer may be carried out in a batch system wherein the respective components are weighed, introduced into a container, and mechanically stirred, or in a continuous production system wherein the respective components and an unreactive gas are continuously fed to a stirring device and mechanically stirred, and the resulting cell dispersed urethane composition is sent onto a base material sheet to form a product.

In the process for producing the layered sheet of the first and third aspect of the invention, it is necessary that after the polyurethane foamed layer is formed on the base material sheet or while the polyurethane foamed layer is formed, the thickness of the polyurethane foamed layer is uniformly regulated. A method of uniformly regulating the thickness of the polyurethane foamed layer includes, but is not limited to, a method of buffing the polyurethane foam with an abrasive, a method of pressing it with a pressing plate, etc. When buffing the polyurethane foamed layer, a layered sheet having no skin layer formed on the surface of the polyurethane foamed layer is obtained. When pressing the polyurethane foamed layer, a layered sheet having a skin layer formed on the surface of the polyurethane foamed layer is obtained. The conditions when pressing are not particularly limited. However, the temperature is preferably regulated to be a glass transition point or more.

On the other hand, the cell dispersed urethane composition prepared by the method described above is applied onto the base material sheet, and a release sheet is laminated on the cell dispersed urethane composition. Thereafter, the cell dispersed urethane composition may be cured to form a polyurethane foamed layer while the thickness thereof is made uniform with a pressing means. The process is particularly preferable since the process can control the thickness of the layered sheet extremely uniformly.

A material for forming the release sheet includes, but is not limited to, resin of the same kind of the base material sheet and paper. The release sheet is preferably a sheet with less dimensional change upon heating. The surface of the release sheet may be subjected to a release treatment.

On the other hand, in the process for producing the layered sheet of the second aspect of the invention, a cell dispersed urethane composition is applied onto a base material sheet, and a release sheet is then laminated on the cell dispersed urethane composition. The cell dispersed urethane composition is cured while making the thickness thereof uniform with a pressing means to form a polyurethane foamed layer. A skin layer is formed on the surface of the polyurethane foamed layer by using the release sheet.

The release sheet used in the second aspect of the invention should have a nitrogen gas permeation rate of $1 \times 10^{-7}$ [cm$^3$/cm$^2$·s·cmHg] or less, and preferably $1 \times 10^{-8}$ [cm$^3$/cm$^2$·s·cmHg] or less. Examples of the forming materials satisfying the condition include polyethylene terephthalate, polypropylene and polyethylene. The release sheet having a small dimensional change caused by heat is preferable. The surface of the release sheet may be subjected to release treatment. The release sheet may be used as a protective sheet as it is without being released after the layered sheet is produced.

In the second aspect of the invention, the thickness of the release sheet is not particularly limited. However, the thickness is preferably 0.025 to 0.3 mm, and more preferably 0.05 to 0.2 mm in terms of the suppression of permeation of gas included in the polyurethane foamed layer, and strength and flexibility of the release sheet.

A pressing means for pressing a sandwich sheet made of the base material sheet, the cell dispersed urethane composition (cell dispersed urethane layer) and the release sheet to make the thickness of the sandwich sheet uniform is not particularly limited, and for example, a method of pressing it to a predetermined thickness with a coater roll, a nip roll or the like. In considering the fact that, after compression, the size of cells in the foamed layer is increased about 1.2 to 2 times, it is preferable in compression to satisfy the following equation: (Clearance of a coater or nip)−(thickness of the base material sheet and release sheet)=(50 to 85% of the thickness of the polyurethane foamed layer after curing). The specific gravity of the cell dispersed urethane composition before passing a roll is preferably 0.24 to 1 in order to obtain a polyurethane foamed layer having a specific gravity of 0.2 to 0.5.

After the thickness of the sandwich sheet is made uniform, the polyurethane foam is reacted until it does not flow, followed by post cure to form a polyurethane foamed layer. The conditions for post cure are the same as described above.

The release sheet on the polyurethane foamed layer is then released to obtain a layered sheet. In this case, a skin layer is formed on the polyurethane foamed layer. After the release sheet is released, the skin layer may be removed by buffing the polyurethane foamed layer.

The thickness of the polyurethane foamed layer is particularly not limited. However, the thickness is preferably 0.2 to 1.2 mm, and more preferably 0.6 to 1 mm.

In the first aspect of the invention, cells in the polyurethane foamed layer may be independent cells, and may be interconnected cells.

The polyurethane foamed layer produced by the process of the second aspect of the invention mainly has an interconnected cell structure, and the rate of the interconnected cell is 50% or more, and preferably 65% or more.

In the third aspect of the invention, the polyurethane foamed layer has spherical interconnected cells with surfaces in which circular holes are formed. The interconnected cells are not formed by crushing.

The average cell diameter of the cells in the polyurethane foamed layer is preferably 20 to 300 μm, and more preferably 50 to 150 μm. When the average cell diameter deviates from this range, the surface smoothness of the material to be polished after polishing tends to be deteriorated. In the third aspect of the invention, the average diameter of the circular holes of the surface of each of the cells is preferably 100 μm or less, and more preferably 50 μm or less.

The average cell diameter difference (maximum value of average cell diameter−minimum value of average cell diameter) of the polyurethane foamed layer in the thickness direction is preferably 50 μm or less, and more preferably 30 μm or less. A method for calculating the average cell diameter difference is based on the description of Example in detail.

A specific gravity of the polyurethane foamed layer is preferably 0.2 to 0.5, and more preferably 0.25 to 0.4. When the specific gravity is less than 0.2, the cell rate tends to be excessively increased to deteriorate the durability. On the other hand, when the specific gravity is more than 0.5, the crosslinking density of the material should be lowered to attain a certain fixed modulus of elasticity. In this case, permanent distortion tends to be increased and durability tends to be deteriorated.

A hardness of the polyurethane foamed layer, as determined by an Asker C hardness meter, is preferably 10 to 50 degrees, and more preferably 15 to 35 degrees. When the Asker C hardness is less than 10 degrees, the durability of the layered sheet tends to be reduced or the surface smoothness of the material to be polished after polishing tends to be deteriorated. On the other hand, when the Asker C hardness is more than 50 degrees, the holdability of the material to be polished tends to be deteriorated.

The compression rate of the polyurethane foamed layer is preferably 2 to 10%, and more preferably 4 to 8%. When the compression rate is less than 2%, the holdability of the material to be polished tends to be deteriorated. When the compression rate is more than 10%, the durability and the surface smoothness of the material to be polished after polishing tends to be deteriorated.

The thickness fluctuation of the polyurethane foamed layer is preferably 100 μm or less, and more preferably 60 μm or less. When the thickness fluctuation is more than 100 μm, the layered sheet has large waviness. As a result, the surface smoothness of the material to be polished after polishing tends to be deteriorated.

Since the layered sheet obtained by the production process of the second aspect of the invention has a holding surface having extremely high surface accuracy, the layered sheet can be used without separately buffing the holding surface using a polishing material. However, the layered sheet may be buffed if needed.

Since the layered sheet having the skin layer formed on each of the polyurethane foamed layers of the first to third aspects of the invention has a holding surface having high surface accuracy, and the skin layer itself has adhesiveness, the layered sheet can sufficiently hold the material to be polished. However, an adhesive layer may be separately provided.

Although the layered sheet having no skin layer formed on the polyurethane foamed layer of each of the first to third aspects of the invention has a holding surface having high surface accuracy, and can moisten the holding surface with water or the like to sufficiently hold the material to be polished. However, an adhesive layer may be separately provided.

A double-side tape for sticking the layered sheet to a polishing head may be provided on the surface of the base material sheet of the layered sheet. The double-side tape has a general constitution in which an adhesive layers are provided on both the surfaces of a base material such as a nonwoven fabric and a film. Examples of compositions of the adhesive layers include a rubber adhesive and acrylic adhesive.

The process for producing a layered sheet according to the fourth aspect of the invention will be described below.

The polyurethane foam as the material for forming the polyurethane foamed layer can be produced by applying a melting method, a solution method or a known polymerization technique, among which preferable is a melting method, consideration being given to a cost, a working environment and the like.

Manufacture of the polyurethane foam is enabled by means of either a prepolymer method or a one shot method.

Manufacture of the polyurethane foam is to mix the first component containing an isocyanate group containing compound and the second component containing an active hydrogen group containing compound to thereby cure the reaction product. In the prepolymer method, an isocyanate-terminated prepolymer serves as an isocyanate group containing compound and a chain extender serves as an active hydrogen group containing compound. In the one shot method, an isocyanate component serves as an isocyanate group containing compound, and a chain extender and a polyol component combined serves as an active hydrogen containing compound.

The polyurethane foam can be produced by a mechanical foaming method and a chemical foaming method or the like. A method for adding hollow beads may be used at the same time if need.

Particularly, a mechanical foaming method using a silicone-based surfactant which is a copolymer of polyalkylsiloxane and polyether is preferable. As such the silicone-based surfactant, SH-192, SH-193 and L-5340 (manufactured by Toray Dow Corning Silicone Co., Ltd.) etc. are exemplified as a suitable compound.

Various additives may be mixed; such as a stabilizer including an antioxidant, a lubricant, a pigment, a filler, an antistatic agent and others.

Description will be given of an example of a method of producing a polyurethane foamed layer having oval cells according to the fourth aspect of the invention below. A method of manufacturing such a polyurethane foamed layer has the following steps.

1) The Foaming Step of Preparing the Cell Dispersed Urethane Composition and the Mixing Step of Mixing the Respective Components Case A. The first component wherein a silicon-based surfactant is added to an isocyanate-terminated prepolymer produced by an isocyanate component with a high-molecular-weight polyol or the like is mechanically stirred in the presence of an unreactive gas, to disperse the unreactive gas as fine cells thereby forming a cell dispersion. Then, the second component containing active hydrogen-containing compounds such as high-molecular-weight and low-molecular-weight polyols are added to, and mixed with, the cell dispersion to prepare a cell dispersed urethane composition. If necessary, a catalyst and a filler such as carbon black may be added to the second component.

Case B. A silicon-based surfactant is added to the first component containing an isocyanate component (or an isocyanate-terminated prepolymer) and/or the second component containing active hydrogen-containing compounds, and the component(s) to which the silicon-based surfactant is added is mechanically stirred in the presence of an unreactive gas, to disperse the unreactive gas as fine cells thereby forming a cell dispersion. Then, the remaining component is added to, and mixed with, the cell dispersion to prepare a cell dispersed urethane composition.

Case C. A silicon-based surfactant is added to at least either of the first component containing an isocyanate component (or an isocyanate-terminated prepolymer) or the second component containing active hydrogen-containing compounds, and the first and second components are mechanically stirred in the presence of an unreactive gas, to disperse the unreactive gas as fine cells thereby preparing a cell dispersed urethane composition.

2) Casting Step

The above cell dispersed urethane composition is injected into a mold, and the mold is then clamped.

3) Curing Step

While the cell dispersed urethane composition injected into the mold is heated to be reacted and cured, the state is held by compressing or decompressing the inside of the mold until the composition does not flow.

The unreactive gas used for forming fine bubbles is preferably not combustible, and is specifically nitrogen, oxygen, a carbon dioxide gas, a rare gas such as helium and argon, and a mixed gas thereof, and the air dried to remove water is most preferable in respect of cost.

As a stirring device for dispersing an unreactive gas in a fine-cell state, any known stirring deices can be used without particular limitation, and specific examples include a homogenizer, a dissolver, a twin-screw planetary mixer, a mechanical froth foaming machine etc. The shape of a stirring blade of the stirring device is not particularly limited, and a whipper-type stirring blade is preferably used to form fine cells.

In a preferable mode, different stirring devices are used for preparing a cell dispersion in the foaming process and for stirring the first and the second components to mix them, respectively. Stirring in the mixing step may not be stirring for forming cells, and a stirring device not generating large cells is preferably used in the mixing step. Such a stirring device is preferably a planetary mixer. The same stirring device may be used in the foaming step of preparing a cell dispersion and in the mixing step of mixing the respective components, and stirring conditions such as a revolution rate of the stirring blade are preferably regulated according to necessary.

As described above, it is necessary to perform a different operation from a conventional mechanical foaming method in the casting step and the curing step in order to produce the polyurethane foam containing oval cells. In detail, the following operation is performed.

1) Case 1

In the casting step, about 50 volume % of a cell dispersed urethane composition is injected into a mold of which one side or an opposite side is movable, and the upper surface of the mold is then covered with an upper lid to clamp the mold.

It is preferable that vent holes for discharging an excessive cell dispersed urethane composition when the mold is compressed are formed in the upper lid of the mold. Thereafter, while the cell dispersed urethane composition is heated to be reacted and cured in the curing step, the side of the mold is moved to compress the mold, and the state is held until the composition does not flow. The composition is preferably compressed to 50 to 95% of the original horizontal width, and more preferably 80 to 90%. The composition is preferably compressed so that the excessive cell dispersed urethane composition is sufficiently discharged from the vent holes. In this case, the long axis of each of the oval cells is roughly perpendicular to the moving direction of the side surface of the mold.

2) Case 2

In the casting step, about 50 volume % of a cell dispersed urethane composition is injected into a mold, and the upper surface of the mold is then covered with an upper lid to clamp the mold. It is preferable that vent holes for discharging the excessive cell dispersed urethane composition when the mold is compressed are formed in at least one side surface of the mold. Thereafter, while the cell dispersed urethane composition is heated to be reacted and cured in the curing step, the upper lid and/or lower surface of the mold is moved to compress the mold, and the state is held until the composition does not flow. The composition is preferably compressed to 50 to 98% of the original height, and more preferably 85 to 95%. The composition is preferably compressed so that the excessive cell dispersed urethane composition is sufficiently discharged from the vent holes. In this case, the long axis of each of the oval cells is roughly perpendicular to the moving direction of the upper lid or lower surface of the mold.

3) Case 3

In the casting step, a cell dispersed urethane composition is injected in an amount capable of forming a space into a mold, and the upper surface of the mold is then covered with an upper lid to clamp the mold. Holes for decompressing the inside of the mold are formed in the upper lid. Thereafter, while the cell dispersed urethane composition is heated to be reacted and cured in the curing step, the inside of the mold is decompressed, and the state is held until the mixed solution does not flow. The composition is preferably compressed to 90 to 30 kPa, and more preferably 90 to 70 kPa. In this case, the long axis of each of the oval cells is roughly perpendicular to the height direction of the mold.

In the method of producing the polyurethane foam, heating and post-curing of the foam block obtained until the dispersion lost fluidity are effective in improving the physical properties of the foam, and are extremely preferable.

In the production of the polyurethane foam, a known catalyst promoting polyurethane reaction, such as tertiary amine-based catalysts, may be used. The type and amount of the catalyst added are determined in consideration of flow time in casting in a predetermined mold after the mixing step.

Then, the obtained polyurethane foam block is sliced using a plane-type or band saw-type slicer to produce a polyurethane foamed layer. In this case, the block is sliced so that the long axis of each of oval cells is parallel to the thickness direction of the foamed layer.

The polyurethane foamed layer obtained by the process has the oval cells of which the long axis has parallel to the thickness direction of the polyurethane foamed layer. The ratio (L/S) of the average major axis L and average minor axis S of the oval cells in the section of the foamed layer is 1.5 to 3, and preferably 1.5 to 2. When L/S is less than 1.5, the modulus of elasticity of the foamed layer cannot be enhanced, and thereby modification of the foamed layer cannot be effectively suppressed. As a result, the surface accuracy of the holding surface holding the material to be polished is deteriorated. When the material to be polished is held using the layered sheet, the surface smoothness of the material to be polished after polishing is reduced. In addition, since the durability of the layered sheet is also reduced, the polishing rate stability in polishing is reduced when the material to be polished is held using the layered sheet. On the other hand, when L/S exceeds 3, the foamed layer easily absorbs slurry and thereby the foamed layer swells to deteriorate the polishing rate stability.

The average major axis of each of the oval cells is preferably 50 to 150 μm, and the average minor axis thereof is preferably 10 to 100 μm. When the axes deviate from this range, the polishing rate stability tends to be deteriorated.

The cells in the polyurethane foamed layer may contain spherical cells. However, the numerical rate of the oval cells is preferably 30% or more of all the cells in order to sufficiently express effect as an object, and more preferably 40% or more. The numerical rate of the oval cells can be regulated to be the range of the object by regulating the compression of the mold or the degree of decompression of the inside of the mold.

The thickness of the polyurethane foamed layer is not particularly limited. However, the thickness is preferably 0.2 to 1.2 mm, and more preferably 0.6 to 1 mm.

The specific gravity of the polyurethane foamed layer is preferably 0.2 to 0.5, and more preferably 0.25 to 0.4. The specific gravity of less than 0.2 tends to cause excessively high cell rate to deteriorate the durability of the polyurethane foamed layer. On the other hand, the specific gravity of more than 0.5 necessitates the low crosslinking density of a material in order to apply a certain fixed modulus of elasticity to the material. In this case, permanent distortion tends to be increased to deteriorate the durability of the polyurethane foamed layer.

The hardness of the polyurethane foamed layer is preferably 10 to 50 degrees by Asker C hardness, and more preferably 15 to 35 degrees. The Asker C hardness of less than 10 degrees tends to reduce the durability of the polyurethane foamed layer and deteriorate the surface smoothness of the material to be polished after polishing. On the other hand, the Asker C hardness of more than 50 degrees tends to deteriorate the holdability of the material to be polished.

The compression rate of the polyurethane foamed layer is preferably 2 to 10%, and more preferably 4 to 8%. The compression rate of less than 2% tends to deteriorate the holdability of the material to be polished. The compression rate of more than 10% tends to deteriorate the durability of the polyurethane foamed layer and the surface smoothness of the material to be polished after polishing.

The thickness fluctuation of the polyurethane foamed layer is preferably 100 μm or less, and more preferably 60 μm or less. When the thickness fluctuation is more than 100 μm, the layered sheet has large waviness. As a result, the surface smoothness of the material to be polished after polishing tends to be deteriorated. Examples of methods for suppressing the thickness fluctuation of the foamed layer include a method for buffing the surface of the foamed layer sliced at a predetermined thickness. It is preferable that the surface of the foamed layer is gradually buffed by using the material to be polished having different particle sizes or the like when the surface is buffed.

The forming material of the base material sheet is not particularly limited. Examples thereof include polyethylene terephthalate, polyester, polyethylene, polypropylene, polystyrene, polyimide, polyvinyl alcohol, polyvinyl chloride, a fluorine-containing resin such as polyfluoroethylene, nylon, and cellulose.

The thickness of the base material sheet is not particularly limited. However, the thickness is preferably about 0.05 to 0.3 mm in terms of the strength and flexibility thereof.

The layered sheet of the fourth aspect of the invention can be produced by sticking the base material sheet and the polyurethane foamed layer together.

Examples of means for sticking the base material sheet and the polyurethane foamed layer together include a method for sticking the base material sheet and the polyurethane foamed layer together using an adhesive, and a method for pressing the base material sheet and the polyurethane foamed layer so as to sandwich a double-side tape between the base material sheet and the polyurethane foamed layer. The double-side tape has a general constitution in which an adhesive layer is provided on both the surfaces of a base material such as a nonwoven fabric and a film. Examples of compositions of the adhesive layer include a rubber adhesive and an acrylic adhesive.

A double-side tape for sticking the layered sheet to a polishing head may be provided on the surface of the base material sheet of the layered sheet.

EXAMPLES

Description will be given of the invention with examples, while the invention is not limited to description in the examples.

[Measurement and Evaluation Method]
(Measurement of Average Cell Diameter)

The prepared polyurethane foamed layer was sliced with a microtome cutter into measurement samples each with the thinnest possible thickness of 1 mm or less. A surface of a sample was photographed with a scanning electron microscope (manufactured by Hitachi Science System Co. with a model number of S-3500N) at a magnification of ×100. An effective circular diameter of each of all cells in an arbitrary area was measured with an image analyzing soft (manufactured by MITANI Corp. with a trade name WIN-ROOF) and an average cell diameter was calculated from the measured values.

(Measurement of Average Cell Diameter Difference)

A section of the produced polyurethane foamed layer was observed at a magnification of ×65 times with SEM. Three straight lines which equally divide the polyurethane foamed layer into four in the thickness direction were drawn on the obtained image. The average value of the line segment lengths of straight lines crossing cells in arbitrary distance of 2 mm of the straight lines was calculated, and this was defined as an average cell diameter. For three straight lines, the average cell diameters were respectively calculated, and the average cell diameter difference (maximum value–minimum value) in the thickness direction was calculated from the maximum value and minimum value of the obtained average cell diameter.

(Measurement of Interconnected Cell Rate)

An interconnected cell rate was measured according to an ASTM-2856-94-C method. However, a measurement sample was prepared by laminating ten polyurethane foamed layers circularly blanked. An air comparison hydrometer 930 type (manufactured by Beckman Corporation) was used as a measuring device. The interconnected cell rate was calculated by the following equation.

Interconnected cell rate(%)=[$(V-V1)/V$]×100

V: Appearance capacity calculated from sample size (cm$^3$)
V1: Capacity of sample measured using air comparison hydrometer (cm$^3$)

(Measurement of Average Cell Diameter of Interconnected Cells and Average Diameter of Circular Holes)

The produced polyurethane foamed layer was parallelly sliced with a razor blade into samples each with the thinnest possible thickness of 1 mm or less. A sample was fixed on a slide glass and observed with SEM (manufactured by Hitachi Science Systems Co. with a model number of S-3500N) at a magnification of ×100. A cell diameter of each of the interconnected cells in an arbitrary area of the obtained image was measured with an image analyzing soft (manufactured by MITANI Corp. with a trade name WIN-ROOF), and an average cell diameter was calculated from the measured values. A circular hole diameter of each of the interconnected cells in the arbitrary area was measured, and the average diameter was calculated from the measured values.

(Measurement of Average Major Axis and Average Minor Axis of Oval Cells, and Rate of Oval Cells)

The produced polyurethane foam sheet was sliced in the thickness direction with a microtome cutter into measurement samples. The section of each of the measurement samples was photographed with a scanning electron microscope (manufactured by Hitachi Science Systems Co. with a model number of S-3500N) at a magnification of ×100. The major axis and minor axis of each of oval cells in an arbitrary area were measured with an image analyzing soft (manufactured by MITANI Corp. with a trade name WIN-ROOF), and the average major axis L, average minor axis S and L/S were calculated from the measured values. The numerical rate (%) of the oval cells to all the cells was calculated.

(Measurement of Nitrogen Gas Permeation Rate)

The nitrogen gas permeation rates [cm$^3$/cm$^2$·s·cmHg] of a base material sheet and release sheet were measured according to ASTM-D-1434. Specifically, the nitrogen gas permeation rates were measured by the following method. The base material sheet and the release sheet were cut out into samples with a size of 12 cm$\phi$. The sample was sandwiched by two plates having a gas penetration area of 10 cm$\phi$, and a pressure difference was generated between both the surfaces of the sample. The nitrogen gas permeation rate was calculated from the slope of change to time of nitrogen gas penetration volume at 25° C. However, when the sample was resin, the pressure difference was set to 0.5 MPa. When the sample was paper, the pressure difference was set to 0.3 MPa.

(Measurement of Specific Gravity)

Determined according to JIS Z8807-1976. The prepared polyurethane foamed layer cut out in the form of a strip of 4 cm×8.5 cm (thickness: arbitrary) was used as a sample for measurement of specific gravity and left for 16 hours in an environment of a temperature of 23±2° C. and a humidity of 50%±5%. Measurement was conducted by using a specific gravity hydrometer (manufactured by Sartorius Co., Ltd).

(Measurement of Hardness)

A hardness was measured in accordance with JIS K-7312. The prepared polyurethane foamed layer was cut into samples with a size of 5 cm×5 cm (with arbitrary thickness), and the samples were left for 16 hours in an environment at a temperature of 23° C.±2° C. and humidity of 50%±5%. When measured, the samples were piled up to a thickness of 10 mm or more. A hardness meter (Asker C hardness meter, pressurized surface height 3 mm, manufactured by Kobunshi Keiki Co., Ltd.) was contacted with a pressurized surface, and 30 seconds later, the hardness was measured.

(Measurement of Compression Rate)

A polyurethane foamed layer was cut out in a circle (with arbitrary thickness) having a diameter of 7 mm into samples, and the samples were left for 40 hours in an environment at a temperature of 23° C.±2° C. and humidity of 50%±5%. When measured, a compression rate was measured with a thermometric analysis measuring device TMA (manufactured by Seiko Instruments Inc. with a model number of SS6000). The calculating equation of the compression rate is as follows.

Compression rate(%)={($T1$−$T2$)/$T1$}×100

T1: the thickness of a polyurethane foamed layer when applying a stress of 4.9 KPa (50 g/cm$^2$) to the polyurethane foamed layer from an unloaded condition for 60 seconds T2: the thickness of a polyurethane foamed layer when applying a stress of 29.4 KPa (300 g/cm$^2$) from a state of T1 for 60 seconds (Evaluation of Polishing Rate Stability)

As a polishing device, SPP600S (manufactured by Okamoto Machine Tool Works, Ltd.) was used. A glass plate was stuck to the produced layered sheet to evaluate the polishing rate stability. The polishing conditions are as follows:

Glass plate: 6 inches ϕ, thickness: 1.1 mm (optical glass, BK7)
Slurry: Ceria slurry (CeO$_2$, 5 wt %)
Slurry amount: 250 ml/min
Polishing pad: MH C 14B (manufactured by Nitta Haas Incorporated)
Polishing pressure: 20 kPa
Number of revolutions of polishing platen: 45 rpm
Number of revolutions of glass plate: 40 rpm
Polishing time: 10 min/plate
Number of glass plates polished: 500

First, the average polishing rate (Å/min) for each of polished glass plates is calculated. The calculation method is as follows:

Average polishing rate=[amount of weight change [g] of glass plate before and after polishing/(glass plate density [g/cm$^3$]×polishing area [cm$^2$] of glass plate×polishing time [min])]×10$^8$ A polishing rate stability (%) is calculated by determining the maximum average polishing rate, minimum average polishing rate and average polishing rate of from a first glass plate to a final treated glass plate (100 plates, 300 plates or 500 plates) and then substituting the above values in the following equation. A lower value of the polishing rate stability (%) is indicative of less change in polishing rate even when a large number of glass plates are polished. In the present invention, it is preferable that the polishing rate stability after treatment of 500 plates is within 10%.

Polishing rate stability(%)={(maximum average polishing rate−minimum average polishing rate)/average polishing rate of all glass plates]}×100

(Evaluation of Adsorptive Property)

A glass plate (50 mmϕ×10 mm thickness) having a smooth surface was adsorbed on a layered sheet (square 80 mm) stuck to a support plate at a pressure of 150 g/cm$^2$ for 10 seconds with the glass plate hanged to a load sensor via an adjustable joint. The glass plate was then pulled up at a constant speed (pulling speed 200 mm/min), and a releasing strength (kPa) when the glass plate was released from the layered sheet was measured.

(Evaluation of Surface Accuracy)

The surface accuracy (10-point average roughness: Rz) of the produced polyurethane foamed layer was measured on the following conditions with a surface roughness measuring device P-15 manufactured by KLA-Tencor.

Measurement length: 800 μm
Measurement speed: 20 μm/s
Measurement load: 2 mg

First Aspect of the Invention

Example 1

90 parts by weight of EP330N (made by Mitsui Takeda Chemical Corporation), 10 parts by weight of diethylene glycol, 5 parts by weight of a silicon-based surfactant (SH-192, made by Toray Dow Corning Silicone Co., Ltd.), 0.2 part by weight of a catalyst (No. 25, made by Kao Corporation) were introduced into a container and mixed. Then, the mixture was stirred vigorously for about 4 minutes at a revolution number of 900 rpm by a stirring blade so as to incorporate bubbles into the reaction system. Thereafter, 38.5 parts by weight of Millionate MTL (made by Nippon Polyurethane Industry Co., Ltd.) were added thereto and stirred for about 1 minute to prepare a cell dispersed urethane composition.

The prepared cell dispersed urethane composition was applied onto a base material sheet (polyethylene terephthalate, thickness 0.2 mm) to form a cell dispersed urethane layer. The cell dispersed urethane layer was covered with a release sheet (polyethylene terephthalate, thickness 0.2 mm) subjected to release treatment. The cell dispersed urethane layer was regulated to be 1.0 mm in thickness with a nip roll and then cured at 70° C. for 40 minutes to form a polyurethane foamed layer. Thereafter, the release sheet formed on the polyurethane foamed layer was released. Then, the surface of the polyurethane foamed layer was buffed to a thickness of 0.8 mm by a buffing machine (manufactured by Amitec) to give a form having regulated thickness accuracy. Thereafter, a template was stuck to the buffing surface of the polyurethane foamed layer, and a double-side tape (double tack tape, manufactured by Sekisui Chemical Co., Ltd.) was further stuck by a laminator to the surface of the base material sheet to produce a layered sheet. FIG. 1 shows a photomicrograph of a cross section of the polyurethane foamed layer. It can be seen that spherical cells are formed in the polyurethane foamed layer.

Example 2

Figure 2:
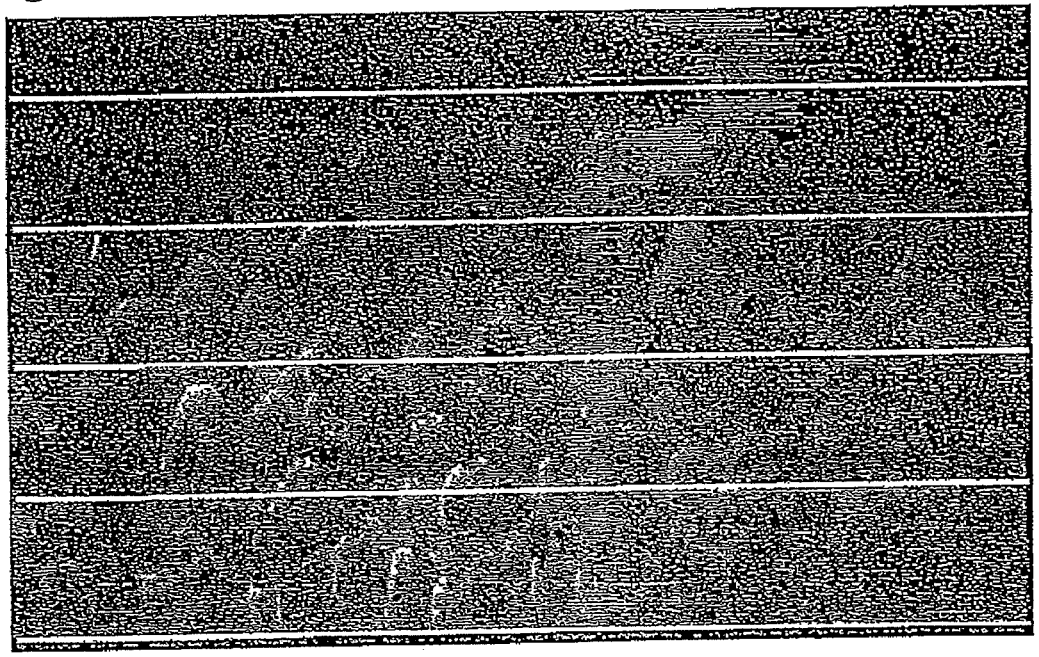
FIG. 2 is a photomicrograph (SEM photograph) of a polyurethane foamed layer of a layered sheet in Example 2.

The cell dispersed urethane composition prepared in Example 1 was applied onto a base material sheet (polyethylene terephthalate, thickness 0.2 mm) to form a cell dispersed urethane layer. Thereafter, the cell dispersed urethane layer was cured at 70° C. for 40 minutes to form a polyurethane foamed layer. Then, the surface of the polyurethane foamed layer was buffed to a thickness of 0.8 mm by a buffing machine (manufactured by Amitec) to give a foam having regulated thickness accuracy. Thereafter, a template was stuck to a buffing surface of the polyurethane foamed layer, and a double-side tape (double tack tape, manufactured by Sekisui Chemical Co., Ltd) was further stuck by a laminator to the surface of the base material sheet to produce a layered sheet. FIG. 2 shows a photomicrograph of a cross section of the polyurethane foamed layer. It can be seen that spherical cells are formed in the polyurethane foamed layer.

Example 3

Figure 3:
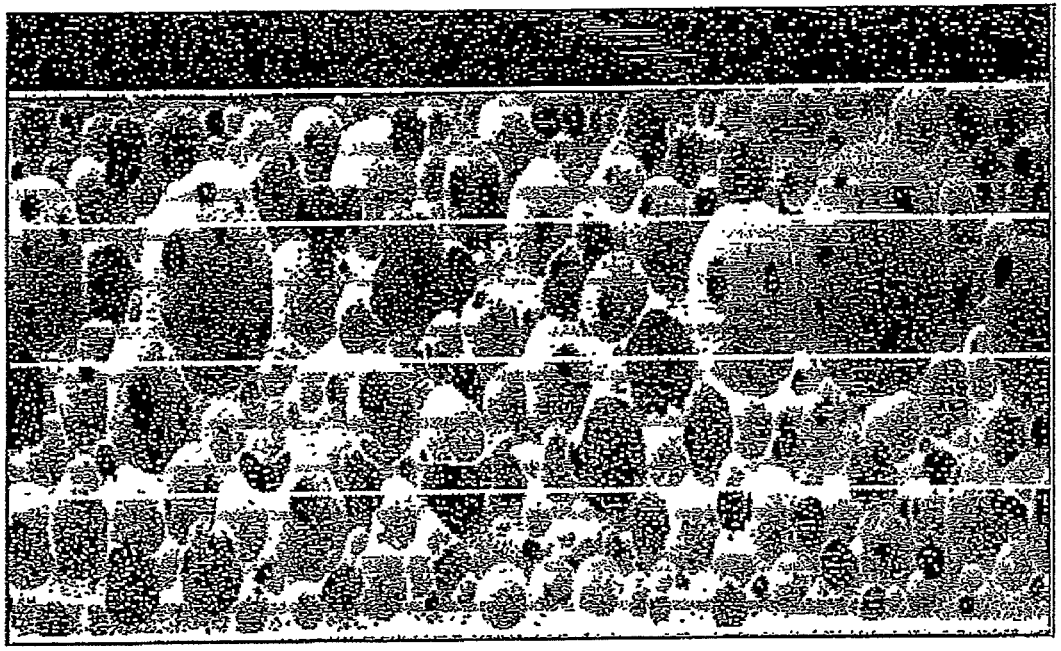
FIG. 3 is a photomicrograph (SEM photograph) of a polyurethane foamed layer of a layered sheet in Example 3.

The cell dispersed urethane composition prepared in Example 1 was applied onto a base material sheet (polyethylene terephthalate, thickness 0.2 mm) to form a cell dispersed urethane layer. The cell dispersed urethane layer was covered with a release sheet (polyethylene terephthalate, thickness 0.2 mm) subjected to release treatment. The cell dispersed urethane layer was regulated to be 0.8 mm in thickness with a nip roll, and then cured at 70° C. for 40 minutes to form a polyurethane foamed layer. Thereafter, the release sheet formed on the polyurethane foamed layer was released. A skin layer was formed on the polyurethane foamed layer. Thereafter, a template was stuck to the skin layer, and a double-side tape (double tack tape, manufactured by Sekisui Chemical Co., Ltd.) was further stuck by a laminator to the surface of the base material sheet to produce a layered sheet. FIG. 3 shows a photomicrograph of a cross section of the polyurethane foamed layer. It can be seen that spherical cells are formed in the polyurethane foamed layer.

Comparative Example 1

Figure 4:
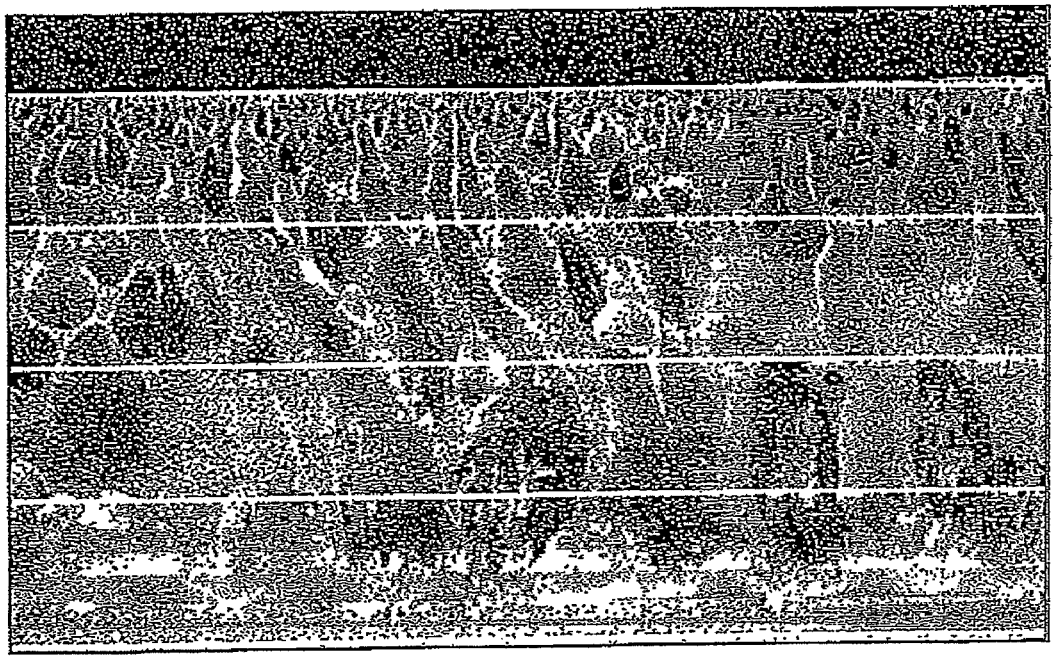
FIG. 4 is a photomicrograph (SEM photograph) of a polyurethane foamed layer of a layered sheet in Comparative Example 1.

10 parts by weight of thermoplastic urethane (Rezamin 7285, made by Dainichiseika Color & Chemicals Mfg. Co., Ltd.) were dissolved in 90 parts by weight of dimethylformamide to prepare an urethane solution. The urethane solution was applied onto a base material sheet (polyethylene terephthalate, thickness 0.2 mm) to form an urethane film. Thereafter, the urethane film-base material sheet was dipped in a DMF-water mixture (DMF/water=30/70) for 30 minutes and dipped in water for 24 hours to replace dimethylformamide by water, whereby a polyurethane foamed layer was formed. Then, a template was stuck to the surface of the polyurethane foamed layer, and a double-side tape (double tack tape, manufactured by Sekisui Chemical Co., Ltd.) was further stuck by a laminator to the base material sheet surface to produce a layered sheet. FIG. 4 shows a photomicrograph of a cross section of the polyurethane foamed layer. It can be seen that thin and long drop-shaped cells are formed in the polyurethane foamed layer.

The second component was stirred vigorously by a stirring blade for about 4 minutes at a revolution number of 900 rpm so as to incorporate bubbles into the reaction system. Thereafter, 40.3 parts by weight of carbodiimide-modified MDI (Millionate MTL, made by Nippon Polyurethane Industry Co., Ltd., NCOwt % 29 wt %, 25° C.) as the first component were added to the second component (NCO/OH=1.1), and stirred for about 1 minute to prepare a cell dispersed urethane composition.

The prepared cell dispersed urethane composition was applied onto a base material sheet (polyethylene terephthalate; made by Toyobo Co., Ltd.; Toyobo Ester E5001; thickness, 0.188 mm; nitrogen gas permeation rate, $3.72 \times 10^{-11}$ [$cm^3/cm^2 \cdot s \cdot cmHg$]) to form a cell dispersed urethane layer. The cell dispersed urethane layer was covered with a release sheet (polyethylene terephthalate; made by Toyobo Co., Ltd.; Toyobo Ester E7002; thickness, 0.05 mm; nitrogen gas permeation rate, $1.15 \times 10^{-10}$ [$cm^3/cm^2 \cdot s \cdot cmHg$]) subjected to release treatment. The cell dispersed urethane layer was regulated to be 0.8 mm in thickness with a nip roll (clearance 0.75 mm), and the cell dispersed urethane layer was then cured at 40° C. for 60 minutes to form a polyurethane foamed layer. Thereafter, the release sheet formed on the polyurethane foamed layer was released. A skin layer was formed on the polyurethane foamed layer. A double-side tape (double tack tape, manufactured by Sekisui Chemical Co., Ltd.) was stuck by a laminator to the surface of the base material sheet to produce a layered sheet. When a section of the polyurethane foamed layer was observed under a microscope, spherical

TABLE 1

| | Average cell diameter (μm) | Average cell diameter difference (μm) | Specific gravity | C hardness (degree) | Compression rate (%) | Average polishing rate (Å/min) | Polishing rate stability (%) | | |
|---|---|---|---|---|---|---|---|---|---|
| | | | | | | | 100 plates | 300 plates | 500 plates |
| Example 1 | 80 | 12.0 | 0.26 | 22 | 4.3 | 3700 | 6 | 7 | 9 |
| Example 2 | 60 | 25.4 | 0.27 | 21 | 4.0 | 3550 | 7 | 7 | 8 |
| Example 3 | 70 | 21.1 | 0.29 | 23 | 4.2 | 3650 | 8 | 8 | 9 |
| Comparative Example 1 | — | 102.0 | 0.26 | 27 | 4.5 | 3600 | 8 | 16 | 22 |

As can be seen from Table 1, the polishing rate is not easily changed even if a large number of wafers are polished by using the layered sheet produced by the production process of the present invention.

Second Aspect of the Invention

Example 1

60 parts by weight of a high-molecular-weight polyol EX-5030 (made by Asahi Glass Co., Ltd., OHV 33, number of functional groups 3), 40 parts by weight of polycaprolactonetriol (made by Daicel Chemical Industries, Ltd., trade name: PCL305, OHV 305, number of functional groups 3), 5 parts by weight of a silicon-based surfactant (SH-192, made by Toray Dow Corning Silicone Co., Ltd.) and 0.18 part by weight of a catalyst (No. 25, made by Kao Corporation) were introduced into a container and mixed to prepare a second component (25° C.). The average hydroxy value (OHVav) was 141.8 mg KOH/g (calculated value), and the average number (fav) of functional groups was 3 (calculated value).

interconnected cells with surfaces in which circular holes were formed had been mainly formed.

Example 2

A layered sheet was produced in the same manner as in Example 1 except that a release sheet (polypropylene; made by Toyobo Co., Ltd.; Toyopal-SS P4256; thickness, 0.05 mm; nitrogen gas permeation rate, $2.33 \times 10^{-9}$ [$cm^3/cm^2 \cdot s \cdot cmHg$]) was used in place of the release sheet described in Example 1. When a section of the polyurethane foamed layer was observed under a microscope, spherical interconnected cells with surfaces in which circular holes had been formed had been mainly formed.

Comparative Example 1

A layered sheet was produced in the same manner as in Example 1 except that a release sheet (made by Oji Paper Co., Ltd.; separator 70GS; thickness, 0.058 mm; nitrogen gas permeation rate, $1.06 \times 10^{-6}$ [$cm^3/cm^2 \cdot s \cdot cmHg$]) was used in place of the release sheet described in Example 1. When a section of the polyurethane foamed layer was observed under a microscope, spherical interconnected cells with surfaces in which circular holes had been formed had been mainly formed.

TABLE 2

|  | Nitrogen gas permeation rate ($cm^3/cm^2 \cdot s \cdot cmHg$) | Average cell diameter (μm) | Interconnected cell rate (%) | Specific gravity | C hardness (degree) | Compression rate (%) | Adsorptive property (kPa) | Surface roughness Rz (μm) |
|---|---|---|---|---|---|---|---|---|
| Example 1 | $1.15 \times 10^{-10}$ | 75.5 | 66 | 0.35 | 31 | 3.47 | 20.0 | 3.78 |
| Example 2 | $2.33 \times 10^{-9}$ | 74.9 | 65 | 0.36 | 32 | 3.52 | 19.6 | 3.88 |
| Comparative Example 1 | $1.06 \times 10^{-6}$ | 59.3 | 61 | 0.41 | 36 | 8.42 | 8.2 | 12.94 |

Since the layered sheets of Examples have extremely high surface accuracy, the layered sheets have excellent adsorptive property. On the other hand, since the layered sheet of Comparative Example has low surface accuracy, the layered sheet has inferior adsorptive property.

Third Aspect of the Invention

Example 1

60 parts by weight of a high-molecular-weight polyol EX-5030 (made by Asahi Glass Co., Ltd., OHV 33, number of functional groups 3), 40 parts by weight of polycaprolactonetriol (made by Daicel Chemical Industries, Ltd., PCL305; OHV305, number of functional groups 3), 5 parts by weight of a silicon-based surfactant (SH-192, made by Toray Dow Corning Silicone Co., Ltd.), and 0.18 part by weight of a catalyst (No. 25, made by Kao Corporation) were introduced into a container and mixed to prepare a second component (25° C.). The average hydroxy value (OHVav) was 141.8 mg KOH/g (calculated value), and the average number (fav) of functional groups was 3 (calculated value). The second component was stirred vigorously by a stirring blade for about 4 minutes at a revolution number of 900 rpm so as to incorporate bubbles into the reaction system. Thereafter, 40.3 parts by weight of carbodiimide-modified MDI (made by Nippon Polyurethane Industry Co., Ltd., Millionate MTL, NCOwt % 29 wt %, 25° C.) as the first component were added to the second component (NCO/OH=1.1) and stirred for about 1 minute to prepare a cell dispersed urethane composition.

The prepared cell dispersed urethane composition was applied onto a base material sheet (polyethylene terephthalate, thickness 0.2 mm) to form a cell dispersed urethane layer. The cell dispersed urethane layer was covered with a release sheet (polyethylene terephthalate, thickness 0.2 mm) subjected to release treatment. The cell dispersed urethane layer was regulated to be 0.8 mm in thickness with a nip roll (clearance 0.75 mm) and cured at 40° C. for 60 minutes to form a polyurethane foamed layer. Thereafter, the release sheet formed on the polyurethane foamed layer was released. A double-side tape (double tack tape, manufactured by Sekisui Chemical Co., Ltd.) was stuck by a laminator to the surface of the base material sheet to produce a layered sheet. When a section of the polyurethane foamed layer was observed under a microscope, spherical interconnected cells with surfaces in which circular holes had been formed had been mainly formed.

Example 2

EX-5030 (85 parts by weight), PCL305 (13 parts by weight), 2 parts by weight of diethylene glycol (OHV 1057, number of functional groups 2), SH-192 (5 parts by weight), and 0.34 part by weight of a catalyst (No. 25) were introduced into a container and mixed to prepare a second component (25° C.). The average hydroxy value (OHVav) was 88.84 mg KOH/g (calculated value), and the average number (fav) of functional groups was 2.98 (calculated value). The second component was stirred vigorously by a stirring blade for about 4 minutes at a revolution number of 900 rpm so as to incorporate bubbles into the reaction system. Thereafter, Millionate MTL (25.2 parts by weight, 25° C.) as the first component was added to the second component (NCO/OH=1.1) and stirred for about 1 minute to prepare a cell dispersed urethane composition. Thereafter, a layered sheet was produced in the same manner as in Example 1. When a section of the polyurethane foamed layer was observed under a microscope, spherical interconnected cells with surfaces in which circular holes had been formed had been mainly formed.

Example 3

45 parts by weight of polymer polyol EX-940 (made by Asahi Glass Co., Ltd., OHV 28, conversion to number of functional groups 3) in which polymer particles made of a styrene-acrylonitrile copolymer were dispersed, 35 parts by weight of polytetramethylene etherglycol (PTMG2000, made by Mitsubishi Chemical Corporation, OHV 56, number of functional groups 2), PCL305 (10 parts by weight), diethylene glycol (10 parts by weight), SH-192 (5 parts by weight), and 0.25 part by weight of a catalyst (No. 25) were introduced into a container and mixed to prepare a second component (25° C.). The average hydroxy value (OHVav) was 137.4 mg KOH/g (calculated value), and the average number (fav) of functional groups was 2.55 (calculated value). The second component was stirred vigorously by a stirring blade for about 4 minutes at a revolution number of 900 rpm so as to incorporate bubbles into the reaction system. Thereafter, Millionate MTL (39 parts by weight, 25° C.) as the first component was added to the second component (NCO/OH=1.1), and stirred for about 1 minute to prepare a cell dispersed urethane composition. Thereafter, a layered sheet was produced in the same manner as in Example 1. When a section of the polyurethane foamed layer was observed under a microscope, spherical interconnected cells with surfaces in which circular holes had been formed had been mainly formed.

Example 4

PTMG2000 (700 parts by weight) and 150 parts by weight of polytetramethylene etherglycol (made by Mitsubishi Chemical Corporation, PTMG650, OHV 173, number of functional groups 2) were introduced into a container and dehydrated under reduced pressure for about 1 hour while being stirred. Thereafter, the inside of the reaction container was substituted by nitrogen. 436 parts by weight of Millionate MT (Pure MDI, made by Nippon Polyurethane Industry Co., Ltd.) were introduced into the reaction container. Thereafter, they was reacted for about 4 hours while the temperature within the reaction system was held at about 80° C. to synthesize an isocyanate-terminated-prepolymer A (NCO wt % 7.53 wt %).

An isocyanate-terminated-prepolymer A (128 parts by weight) and SH-192 (5 parts by weight) were introduced into a container and mixed. The mixture was regulated to be 40° C., and defoamed under reduced pressure to prepare a first component. The first component was stirred vigorously by a stirring blade for about 4 minutes at a revolution number of 900 rpm so as to incorporate bubbles into the reaction system. Thereafter, the first component was added to a second component in which 15 parts by weight of triethylene glycol (OHV 747, number of functional groups 2) regulated to be 25° C. and 0.12 part by weight of a catalyst (No. 25) were mixed (NCO/OH=1.15) and stirred for about 1 minute to prepare a cell dispersed urethane composition. The average hydroxy value (OHVav) was 177.2 mg KOH/g (calculated value), and the average number (fav) of functional groups was 2 (calculated value). Thereafter, a layered sheet was produced in the same manner as in Example 1. When a section of the polyurethane foamed layer was observed under a microscope, spherical interconnected cells with surfaces in which circular holes had been formed had been mainly formed.

Comparative Example 1

EX-5030 (90 parts by weight), PCL305 (8 parts by weight), diethylene glycol (2 parts by weight), SH-192 (5 parts by weight) and 0.36 part by weight of a catalyst (No. 25) were introduced into a container and mixed to prepare a second component (25° C.). The average hydroxy value (OHVav) was 75.24 mg KOH/g (calculated value), and the average number (fav) of functional groups was 2.98 (calculated value). The second component was stirred vigorously by a stirring blade for about 4 minutes at a revolution number of 900 rpm so as to incorporate bubbles into the reaction system. Thereafter, Millionate MTL (21.4 parts by weight, 25° C.) as the first component was added to the second component (NCO/OH=1.1) and stirred for about 1 minute to prepare a cell dispersed urethane composition. Thereafter, a layered sheet was produced in the same manner as in Example 1. When a section of the polyurethane foamed layer was observed under a microscope, most cells were independent cells.

Comparative Example 2

PTMG650 (850 parts by weight) was introduced into a container, and dehydrated under reduced pressure for about 1 hour while being stirred. Thereafter, the inside of the reaction container was substituted by nitrogen. Millionate MT (635 parts by weight) was introduced into the reaction container. Thereafter, they were reacted for about 4 hours to synthesize an isocyanate-terminated-prepolymer B (NCO wt % 6.99 wt %) while the temperature within the reaction system was held at about 80° C.

The isocyanate-terminated-prepolymer B (150 parts by weight) and SH-192 (5 parts by weight) were introduced into a container, mixed, regulated to be 40° C., and defoamed under reduced pressure to prepare a first component. The first component was stirred vigorously by a stirring blade for about 4 minutes at a revolution number of 900 rpm so as to incorporate bubbles into the reaction system. Thereafter, a second component in which triethylene glycol (15 parts by weight) regulated to be 25° C. and 0.1 part by weight of a catalyst (No. 25) were mixed was added to the first component (NCO/OH=1.25), and stirred for about 1 minute to prepare a cell dispersed urethane composition. The average hydroxy value (OHVav) was 259.1 mg KOH/g (calculated value), and the average number (fav) of functional groups was 2 (calculated value). Thereafter, a layered sheet was produced in the same manner as in Example 1. When a section of the polyurethane foamed layer was observed under a microscope, most cells were independent cells.

Comparative Example 3

PTMG2000 (550 parts by weight) and PTMG650 (200 parts by weight) were introduced into a container, and dehydrated under reduced pressure for about 1 hour while being stirred. Thereafter, the inside of the reaction container was substituted by nitrogen. Millionate MT (620 parts by weight) was introduced into the reaction container. Thereafter, they were reacted for about 4 hours to synthesize an isocyanate-terminated-prepolymer C(NCO wt % 11.73 wt %) while the temperature within the reaction system was held at about 80° C.

The isocyanate-terminated-prepolymer C (137 parts by weight) and SH-192 (5 parts by weight) were introduced into a container, mixed, regulated to be 40° C., and defoamed under reduced pressure to prepare a first component. The first component was stirred vigorously by a stirring blade for about 4 minutes at a revolution number of 900 rpm so as to incorporate bubbles into the reaction system. Thereafter, a second component in which triethylene glycol (25 parts by weight) regulated to be 25° C. and 0.08 part by weight of a catalyst (No. 25) were mixed was added to the first component (NCO/OH=1.15), and stirred for about 1 minute to prepare a cell dispersed urethane composition. The average hydroxy value (OHVav) was 252.15 mg KOH/g (calculated value), and the average number (fav) of functional groups was 2 (calculated value). Thereafter, a layered sheet was produced in the same manner as in Example 1. When a section of the polyurethane foamed layer was observed under a microscope, most cells were independent cells.

TABLE 3

|  | Average cell diameter (μm) | Average diameter (μm) | Interconnected cell rate (%) | Specific gravity | C hardness (degree) | Compression rate (%) | Adsorptive property (kPa) |
| --- | --- | --- | --- | --- | --- | --- | --- |
| Example 1 | 75.5 | 24.2 | 66 | 0.35 | 31 | 3.47 | 20.0 |
| Example 2 | 67.1 | 23.6 | 65 | 0.37 | 19 | 7.65 | 43.1 |
| Example 3 | 65.8 | 25.5 | 65 | 0.36 | 18 | 4.28 | 23.9 |
| Example 4 | 60.5 | 22.3 | 57 | 0.45 | 25 | 9.90 | 10.0 |
| Comparative Example 1 | 59.3 | — | 11 | 0.46 | 26 | 2.90 | 48.1 |
| Comparative Example 2 | 55.6 | — | 21 | 0.51 | 79 | 2.20 | 2.2 |
| Comparative Example 3 | 56.6 | — | 15 | 0.44 | 68 | 1.40 | 3.9 |

Since the layered sheets of Examples 1 to 4 have an interconnected cell structure, the layered sheets have high surface accuracy and have excellent adsorptive property. Although the layered sheet of Comparative Example 1 have an independent cell structure and have excellent adsorptive property, the layered sheet have poor surface accuracy. Therefore, the polishing uniformity of the material to be polished in polishing is reduced. The layered sheets of Comparative Examples 2 and 3 have an independent cell structure, and have poor adsorptive property and surface accuracy.

Fourth Aspect of the Invention

Example 1

60 parts by weight of a high-molecular-weight polyol EX-5030 (made by Asahi Glass Co., Ltd., OHV 33, number of functional groups 3), 40 parts by weight of polycaprolactonetriol (made by Daicel Chemical Industries, Ltd., PCL305, OHV 305, number of functional groups 3), 5 parts by weight of a silicon-based surfactant (SH-192, made by Toray Dow Corning Silicone Co., Ltd.) and 0.18 part by weight of a catalyst (No. 25, made by Kao Corporation) were introduced into a container, and mixed to prepare a second component (25° C.). The second component was stirred vigorously by a stirring blade for about 4 minutes at a revolution number of 900 rpm so as to incorporate bubbles into the reaction system. Thereafter, 40.3 parts by weight of carbodiimide-modified MDI (made by Nippon Polyurethane Industry Co., Ltd., Millionate MTL, NCOwt % 29 wt %, 25° C.) as the first component was added to the second component (NCO/OH=1.1) and stirred for about 1 minute to prepare a cell dispersed urethane composition.

The cell dispersed urethane composition was injected into a mold (width 800 mm, length 1300 mm, height 35 mm) until the height of liquid surface was set to 31 mm (88 volume %). Thereafter, the upper surface of the mold was covered with an upper lid in which vent holes of φ 3 mm were formed at an interval of 3 mm to clamp the mold. Thereafter, while the composition was heated at 70° C. to be reacted and cured, the side surface of the mold was moved, and the horizontal width of the mold was compressed to 700 mm from 800 mm. The state is held until the mixed solution does not flow. The excessive composition was discharged from the vent holes. Thereafter, the composition was post-cured at 70° C. for 1 hour to obtain a polyurethane foam block.

Using a band saw-type slicer (manufactured by Fecken Corporation), the polyurethane foam block was sliced so that the long axis of each of oval cells was parallel to the thickness direction to obtain a polyurethane foam sheet. Then, the surface of the sheet was buffed by a buffing machine (manufactured by Amitec) until the thickness was set to 0.8 mm, thereby regulating the thickness accuracy. The buffed sheet was punched into a diameter of 17 cm to obtain a polyurethane foamed layer. Thereafter, the polyurethane foamed layer and the base material sheet (polyethylene terephthalate, thickness 0.2 mm) were stuck together by a double-side tape (double tack tape, manufactured by Sekisui Chemical Co., Ltd.). Thereafter, a template was stuck to the buffing surface of the polyurethane foamed layer. A double-side tape (double tack tape, manufactured by Sekisui Chemical Co., Ltd.) was further stuck by a laminator to the surface of the base material sheet to produce a layered sheet.

Example 2

45 parts by weight of polymer polyol EX-940 (made by Asahi Glass Co., Ltd., OHV 28, conversion to number of functional groups 3) in which polymer particles made of a styrene-acrylonitrile copolymer were dispersed, 35 parts by weight of polytetramethylene ether glycol (made by Mitsubishi Chemical Corporation, PTMG2000, OHV 56, number of functional groups 2), PCL305 (10 parts by weight), diethylene glycol (10 parts by weight), SH-192 (5 parts by weight), and 0.25 part by weight of a catalyst (No. 25) were introduced into a container and mixed to prepare a second component (25° C.). The second component was stirred vigorously by a stirring blade for about 4 minutes at a revolution number of 900 rpm so as to incorporate bubbles into the reaction system. Thereafter, Millionate MTL (39 parts by weight, 25° C.) as the first component was added to the second component (NCO/OH=1.1), and stirred for about 1 minute to prepare a cell dispersed urethane composition. Thereafter, a layered sheet was produced in the same manner as in Example 1.

Example 3

The cell dispersed urethane composition was prepared in the same manner as in Example 1. The cell dispersed urethane composition was injected into a mold (width 800 mm, length 1300 mm, height 35 mm) until the height of liquid surface was set to 31 mm (88 volume %). Thereafter, the upper surface of the mold was covered with an upper lid in which vent holes of φ 3 mm were formed at an interval of 3 mm to clamp the mold. Thereafter, the mold was put into a vacuum oven where the composition was heated at 70° C. to be reacted and cured. The pressure was simultaneously reduced to 80 kPa, and the state is held until the mixed solution does not flow. The excessive composition was discharged from the vent holes. Thereafter, the composition was post-cured at 70° C. for 1 hour to obtain a polyurethane foam block. Thereafter, a layered sheet was produced in the same manner as in Example 1.

Example 4

EX-5030 (90 parts by weight), PCL305 (8 parts by weight), diethylene glycol (2 parts by weight), SH-192 (5 parts by weight), and 0.36 part by weight of a catalyst (No. 25) were introduced into a container, and mixed to prepare a second component (25° C.). The second component was stirred vigorously by a stirring blade for about 4 minutes at a revolution number of 900 rpm so as to incorporate bubbles into the reaction system. Thereafter, Millionate MTL (21 parts by weight, 25° C.) as the first component was added to the second component (NCO/OH=1.1), and stirred for about 1 minute to prepare a cell dispersed urethane composition. Thereafter, a layered sheet was produced in the same manner as in Example 1.

Comparative Example 1

A cell dispersed urethane composition was prepared in the same manner as in Example 1. The cell dispersed urethane composition was injected into a mold (width 800 mm, length 1300 mm, height 35 mm). Thereafter, the composition was heated at 70° C. to be reacted and cured. Thereafter, the composition was post-cured at 70° C. for 1 hour to obtain a polyurethane foam block. Thereafter, a layered sheet was produced in the same manner as in Example 1.

Comparative Example 2

A polyurethane foam block was obtained in the same manner as in Example 1. Using a band saw-type slicer (manufactured by Fecken Corporation), the polyurethane foam block was sliced so that the long axis of each of oval cells was perpendicular to the thickness direction to obtain a polyurethane foam sheet. Thereafter, a layered sheet was produced in the same manner as in Example 1.

TABLE 4

| | Direction of long axis of oval cells to thickness direction of foamed layer | Average major axis L (μm) | Average minor axis S (μm) | L/S | Rate of oval cells (%) | Inter-connected cell rate (%) | Specific gravity | C hardness (degree) | Com-pression rate (%) | Adsorp-tive prop-erty (kPa) | Polishing rate stability (%) | | |
|---|---|---|---|---|---|---|---|---|---|---|---|---|---|
| | | | | | | | | | | | 100 plates | 300 plates | 500 plates |
| Example 1 | Parallel | 125 | 70 | 1.8 | 50 | 60 | 0.25 | 22 | 4.6 | 25.4 | 5 | 6 | 7 |
| Example 2 | Parallel | 145 | 65 | 2.2 | 60 | 67 | 0.26 | 26 | 4.1 | 27.8 | 5 | 7 | 8 |
| Example 3 | Parallel | 180 | 65 | 2.8 | 70 | 61 | 0.29 | 30 | 4.2 | 30.1 | 6 | 7 | 8 |
| Example 4 | Parallel | 140 | 70 | 2.0 | 65 | 13 | 0.27 | 25 | 4.3 | 24.1 | 6 | 8 | 10 |
| Comparative Example 1 | Parallel | 95 | 75 | 1.3 | 18 | 62 | 0.26 | 25 | 4.1 | 18.3 | 6 | 10 | 15 |
| Comparative Example 2 | Perpendicular | 125 | 70 | 1.8 | 50 | 60 | 0.25 | 8 | 12 | 16.8 | 9 | 15 | 24 |

As can be seen from Table 4, the layered sheet of the present invention has excellent property for adsorptively holding the material to be polished and has excellent durability, thereby having excellent stability of polishing rate for a long time.

While various embodiments, aspects and modes of the invention have been described above, it should be understood that they have been presented by way of example only, and not as limitations. It will be understood by those skilled in the art that various changes in form and details may be made therein without departing from the spirit and scope of the invention. Thus, the breadth and scope of the invention should not be limited by any of the above-described exemplary embodiments, aspects and modes, but should be defined only in accordance with the following claims and their equivalents.

The invention claimed is:

1. A layered sheet, comprising:
a base material sheet; and
a polyurethane foamed layer,
wherein the polyurethane foamed layer has interconnected oval cells having a long axis parallel to a thickness direction of the polyurethane foamed layer, and a ratio of an average major axis L to an average minor axis S of the oval cells in a section of the polyurethane foamed layer is 1.5 to 3,
the oval cells have an average major axis L of 50 to 150 μm and an average minor axis S of 10 to 100 μm,
the interconnected oval cells have cell surfaces in which circular holes are formed so that an average diameter of the circular holes is 50 μm or less, and
wherein a polishing rate stability of the layered sheet after treatment of 500 glass substrates is within 10%.

2. The layered sheet according to claim 1, wherein a numerical rate of the oval cells is 30% or more of all the cells.

* * * * *